(12) United States Patent
Seko et al.

(10) Patent No.: US 8,129,709 B2
(45) Date of Patent: Mar. 6, 2012

(54) NONVOLATILE MEMORY DEVICE

(75) Inventors: Akiyoshi Seko, Tokyo (JP); Yukio Fuji, Tokyo (JP); Natsuki Sato, Tokyo (JP); Isamu Asano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 85 days.

(21) Appl. No.: 12/618,302

(22) Filed: Nov. 13, 2009

(65) Prior Publication Data

US 2010/0123114 A1  May 20, 2010

(30) Foreign Application Priority Data

Nov. 18, 2008 (JP) ................................. 2008-294377

(51) Int. Cl.
*H01L 45/00* (2006.01)

(52) U.S. Cl. .................... 257/5; 257/2; 257/4; 257/202; 257/209; 257/E45.002

(58) Field of Classification Search .................. 257/2, 4, 257/5, 202, 209, E45.002
See application file for complete search history.

(56) References Cited

U.S. PATENT DOCUMENTS 7,071,485 B2 * 7/2006 Takaura et al. .................... 257/3

(Continued)

FOREIGN PATENT DOCUMENTS

JP     2007-287794 A    11/2007

OTHER PUBLICATIONS

Dae-Hwang Kim et al., Simulation-Based Comparison of Cell Design Concepts for Phase Change Random Access Memory, Journal of Nanoscience and Nanotechnology, 2007, pp. 298-305, vol. 7.

(Continued)

*Primary Examiner* — Victor A Mandala
(74) *Attorney, Agent, or Firm* — Foley & Lardner LLP

(57) ABSTRACT

A nonvolatile memory device (21) is provided with a semiconductor substrate, a plurality of active regions (3) formed on the semiconductor substrate and extending in a band, a plurality of select active elements (23) formed in the active regions (3) and having a first impurity diffusion region and a second impurity diffusion region, a plurality of first electrodes (13) electrically connected to the first impurity diffusion region, a variable resistance layer (12) electrically connected to the first electrodes (13), and a plurality of second electrodes electrically connected to the variable resistance layer (12). Among the plurality of first electrodes (13) and the plurality of second electrodes, an array direction of at least one pair of the first electrodes (13) and the second electrodes that are electrically connected to the same variable resistance layer (12), and a direction of extension of the activation regions (3) are not parallel.

17 Claims, 17 Drawing Sheets

U.S. PATENT DOCUMENTS

| | | | |
|---|---|---|---|
| 7,800,095 B2 * | 9/2010 | An et al. ............................ | 257/5 |
| 7,883,931 B2 * | 2/2011 | Liu .................................. | 438/97 |
| 8,049,258 B2 * | 11/2011 | Burgess et al. ................. | 257/296 |
| 2007/0241380 A1 | 10/2007 | Hasunuma | |
| 2008/0149910 A1 * | 6/2008 | An et al. ............................ | 257/4 |
| 2008/0303015 A1 * | 12/2008 | Happ et al. ........................ | 257/5 |
| 2008/0304310 A1 * | 12/2008 | Philipp et al. ................. | 365/148 |
| 2009/0059652 A1 * | 3/2009 | Taguchi ........................ | 365/148 |
| 2009/0108247 A1 * | 4/2009 | Takaura et al. .................... | 257/2 |
| 2009/0250680 A1 * | 10/2009 | Takaura et al. .................... | 257/2 |
| 2010/0001251 A1 * | 1/2010 | Chang .............................. | 257/2 |
| 2010/0090193 A1 * | 4/2010 | Mikawa et al. .................... | 257/4 |
| 2010/0096669 A1 * | 4/2010 | Popp et al. .................... | 257/202 |

OTHER PUBLICATIONS

Martijn H. R. Lankhorst et al., Low-cost and Nanoscale Non-volatile Memory Concept for Future Silicon Chips, Nature Materials, 2005, pp. 347-352, vol. 4, Nature Publishing Group.

Y. H. Ha et al., An Edge Contact Type Cell for Phase Change RAM Featuring Very Low Power Consumption, Symposium on VLSI Technology Digest of Technical Papers, 2003, pp. 175, 12B-4.

* cited by examiner

NONVOLATILE MEMORY DEVICE

REFERENCE TO RELATED APPLICATION

This application is based upon and claims the benefit of the priority of Japanese patent application No. 2008-294377, filed on Nov. 18, 2008, the disclosure of which is incorporated herein in its entirety by reference thereto.

TECHNICAL FIELD

The present invention relates to a nonvolatile memory device that uses a variable resistance material as an information recording medium.

BACKGROUND

In the present advanced information society, improvement in performance of solid-state memory devices formed using semiconductor integrated circuit technology has become essential. In particular, together with improvement in computational capability of Micro Processing Units (MPU) there has been a steady increase in memory capacity required for computers and electronic devices. Unlike magnetic and magneto optical storage devices such as hard disks, laser disks, and the like, since the solid-state memory devices do not have a physical driving part therein, the devices have a high mechanical strength and can be highly integrated based on semiconductor manufacturing technology. Therefore, the solid-state memory devices have been used not only as a temporary storage device (cache) or a main storage device (main memory) for a computer or a server, but also as an external storage device (storage memory) for a large number of mobile devices and domestic electrical appliances, and the present market is of the order of several tens of billions of dollars.

Such solid-state memory devices can be classified into three types according to their principle of operation: static random access memory (SRAM), dynamic random access memory (DRAM), and electrically erasable and programmable read only memory (EEPROM) represented by a flash memory device. Among these, the SRAM has the fastest operation, but it cannot retain information when power supply is stopped, and requires a large number of transistors for one bit, which is not suitable for providing a large capacity. Therefore, the SRAM is mainly used as a cache in an MPU. The DRAM requires refresh operations and operating speed is inferior to that of the SRAM; however, it can easily be integrated and unit cost per one bit is lower, so that it is principally used as a main memory for computers devices and household electrical appliances. On the other hand, the EEPROM is a non-volatile memory device capable of retaining information even while power supply is turned off; since the EEPROM speed is slower when writing and erasing information compared to the above two devices and requires relatively large electrical power, it is mainly used as storage memory.

With the rapid growth in the market for mobile devices in recent years, there has been anticipation for the development of a DRAM-compatible solid-state memory device that has higher speed and is capable of operating at a lower power consumption, and furthermore for the development of a non-volatile solid-state memory device having features of both the DRAM and EEPROM. For such next-generation solid-state memory devices, an attempt has been made to develop a resistive random access (ReRAM) using a variable resistance material, and a ferroelectric RAM (FeRAM) using a ferroelectric substance. In addition, one promising candidate for a non-volatile memory device which has higher speed and is capable of operating at a lower power consumption is a resistance memory device that uses a phase change material, which is a variable resistance material as mentioned above, and this is referred to in particular as a phase change random access memory (PRAM). The phase change random access memory writes information at a very high speed, as high as about 50 ns, and has the advantage of being easy to integrate because of its simple device configuration.

The phase change random access memory is a nonvolatile memory device having a structure in which a phase change material is sandwiched between two electrodes, and the memory device is selectively operated by using an active element connected in series in a circuit. As the active element, for example, a MOS (metal-oxide-semiconductor) transistor, a junction diode, a bipolar transistor, a Schottky barrier diode, or the like, may be cited.

Storage and erasure of data in the phase change memory device are performed by using thermal energy to cause a transition between two or more solid phases, such as a (poly) crystal state and an amorphous state in a phase change material. The transition between the crystal state and the amorphous state is identified as change in a resistance value by a circuit connection through the electrodes. With regard to application of the thermal energy to the phase change material, an electrical pulse (voltage or current pulse) is applied between the electrodes to heat the phase change material itself by Joule heating. In this regard, for example, an electrical pulse of a large current is applied to a phase change material in a crystal state for a short time to heat the phase change material to a high temperature close to melting point and then cool it rapidly, to have an amorphous state (this state is referred to as a "reset state"). This operation is generally referred to as a reset operation. On the other hand, in the reset state, an electrical pulse of a current that is small in comparison with the reset operation is applied for a relatively long time, to heat the phase change material to the temperature of crystallization, to have a crystal state (this state is referred to as a "set state"). This operation is referred to as a set operation in contrast to the reset operation.

With regard to the phase change random access memory, there exist a vertical phase change memory device and a lateral phase change memory device.

The vertical phase change memory device is disclosed, for example, in Non-Patent Document 1. The vertical phase change memory device has a structure in which two electrodes in contact with phase change material are arrayed perpendicularly (vertically) with respect to the phase change material. In the vertical phase change memory device, a memory cell array is formed by arranging, in a lattice, cells combining phase change memory elements and select active elements. A feature of the vertical phase change memory device is that high integration is easy, and in addition, because of similarity to the structure of the DRAM, it is possible to use DRAM cell integration technology.

For example, Patent Document 1 describes one example of a layout of a DRAM having cell area of 6 $F^2$. Here, F is a minimum processing dimension (a value of half of a word line spacing within a cell). In this layout, an active region is formed axisymmetrically, and word lines are wired in a Y direction at 1 F intervals. Cell contacts are formed in a central portion and on both side portions of the active region. After bit line contacts are formed directly above cell contacts of the central portion, the bit lines pass over the bit line contacts concerned, and extend in an X direction while meandering so as to avoid cell contacts at both side portions. Storage node contacts are formed on the cell contacts formed at both side portions of the active region. A central position of the storage node contacts is out of alignment with a central position of the cell contacts, and in this way, the storage node contacts are disposed to have equal spacing in an X direction. A storage capacitor is formed directly above the storage node contacts.

For the vertical phase change memory device it is possible to use a DRAM layout as described in Patent Document 1. Furthermore, by devising a configuration of memory cells and memory cell peripheral circuitry, according to the case, it is possible to also form a memory cell that does not have select active elements.

The lateral phase change memory device is disclosed, for example, in Non-Patent Document 2. In the lateral phase change memory device, two electrodes electrically connected to the phase change material are disposed laterally (on either side) to the phase change region in a planar form. Furthermore, an edge contact type also exists for the lateral phase change memory, as disclosed in Non-Patent Document 3.

[Patent Document 1]
JP Patent Kokai Publication No. JP-P2007-287794A
[Non-Patent Document 1]
Dae-Hwang Kim, et al., Simulation-based comparison of cell design concepts for phase change random access memory, Journal of Nanoscience and Nanotechnology, Vol. 7, pp. 298-305, 2007.
[Non-Patent Document 2]
Martijn H. R. Lankhorst, et al., Low-cost and nanoscale non-volatile memory concept for future silicon chips, Nature Materials, Nature Publishing Group, Vol. 4, pp. 347-352, 2005.
[Non-Patent Document 3]
Y. H Ha, et al., An edge contact type cell for phase change RAM featuring very low power consumption, 2003 Symposium on VLSI Technology, Digest of Technical Papers, 12B-4, pp. 175, 2003.

SUMMARY

The entire disclosures of Patent Document 1 and Non-Patent Documents 1 to 3 are incorporated herein by reference thereto.

The following analysis is given from a viewpoint of the present invention.

In order to activate the phase change memory device by the select active elements, for example, it is necessary to perform rewriting of information within a range of drive current capability of the select active elements. A phase change region of the phase change material in the phase change memory device (refer to Non-Patent Document 1, for example), is principally formed in a portion with highest current density when information is being written. For example, for a vertical phase change memory device, in a case of a structure where the phase change material is not enclosed by an insulator, a portion of highest current density where the phase change material and a lower electrode are in contact generates heat, and this portion principally causes phase change. For example, in a case of performing a reset operation from a set state, in order to distinguish a state transition of the phase change material as a change of resistance value, it is desirable that, in the phase change material, a portion in contact with the lower (or an upper) electrode is entirely covered by the phase change region, or that all current routes flowing within the phase change material necessarily pass through the phase change region. Therefore it is effective to reduce (scale) the phase change region of the phase change material in order to make the vertical phase change memory device perform a switching operation at a low current within the range of the drive current capability of the select active elements. For example, for a vertical phase change memory device, in a case of a structure where the phase change material is not enclosed by an insulator, reducing contact area of the phase change material and the electrode is effective in reducing the phase change region. In this way, it is possible to reduce power consumption when rewriting information. The phase change region is a region where phase change actually occurs, and there is no necessity for the entire volume of the formed phase change material to be the phase change region.

Furthermore, in the vertical phase change memory device, when Joule heat generation of the phase change material itself occurs, the electrode is the location of greatest heat release. From this viewpoint also, reduction of the contact cross-sectional area between the electrode and the phase change material, and reduction of the cross-sectional area of the electrode itself are effective in suppressing heat release from the phase change material and efficiently causing phase change.

However, in the vertical phase change memory device, a dimension of the electrode connected to the phase change material is determined by a minimum processing dimension in lithography processing in a general semiconductor manufacturing process, so that reduction beyond process trends is difficult. That is, in the vertical phase change memory device, the contact area between the phase change material and the electrode inevitably becomes large. As a result, current amount necessary for phase change becomes large, and current reduction when data rewriting is performed becomes difficult. The minimum processing dimension is a minimum formable processing line width dimension or minimum formable processing space dimension, determined by a manufacturing process such as photolithography resolution capability or etching processing capability.

Furthermore, with regard to the vertical phase change memory device, since the phase change region and the electrodes are adjacent, in addition to a large area of contact of the phase change material and the electrodes, there is a problem in that heat release becomes too high, and heat generation efficiency is bad.

On the other hand, with regard to the lateral phase change memory device, the reduction of the phase change region does not depend on the minimum processing dimension for lithography processing and can be achieved by making the phase change material thin. As a result, in comparison to the vertical phase change memory device, rewriting of data is possible with a small current amount. Furthermore, since the contact area of the phase change material and the electrodes disposed on the left and right can be made relatively large, in comparison to the vertical phase change memory device, low resistance contacts are facilitated at an interface of the phase change material and the electrodes. In addition, since it is possible to reduce the phase change region by making the phase change material thin or fine, the phase change region can be distanced from the electrodes, and it is possible to suppress excessive heat release by the electrodes when a phase change is being performed.

On the other hand, however, in the lateral phase change memory device, it is impossible to realize high integration by using a DRAM layout as described in Patent Document 1. For example, in comparison to the vertical phase change memory device, with the lateral phase change memory device only one electrode can be disposed on a cell contact connected to the select active element, and in this way a bit line contact connected to the other electrode cannot also be disposed on a cell contact. That is, in the lateral phase change memory device, area in a lateral direction is necessary for disposal of elements. As a result, with regard to the lateral phase change memory device, a layout is desired in which high integration is possible.

According to a first aspect of the present invention, there is provided a nonvolatile memory device that comprises: a plurality of select active elements, and a plurality of memory parts. Any one of the select active elements has a first impurity diffusion region and a second impurity diffusion region formed in an active region formed on a semiconductor substrate. Any one of the memory parts has a first electrode electrically connected to the first impurity diffusion region, a variable resistance layer electrically connected to the first electrode, and a second electrode electrically connected to the variable resistance layer. In at least one memory part among the plurality of memory parts, an array direction of the first electrode and the second electrode is not parallel with an array direction of the first impurity diffusion region and the second impurity diffusion region.

According to a second aspect of the present invention, there is provided a nonvolatile memory device that comprises: a semiconductor substrate; a plurality of active regions formed on the semiconductor substrate and extending in a band. The memory device further comprises: a plurality of select active elements, formed in the active regions, each having a first impurity diffusion region and a second impurity diffusion region; a plurality of first electrodes electrically connected to the first impurity diffusion region; a variable resistance layer electrically connected to the first electrodes, and a plurality of second electrodes electrically connected to the variable resistance layer. Among the plurality of first electrodes and the plurality of second electrodes, an array direction of at least one pair of first electrode and second electrode that are electrically connected to the same variable resistance layer is not parallel with a direction of extension of the active regions.

According to a third aspect of the present invention, there is provided a nonvolatile memory device that comprises: a semiconductor substrate; a plurality of active regions formed on the semiconductor substrate and extending in a band. The memory device further comprises: a plurality of select active elements, formed in the active regions, each having a first impurity diffusion region and a second impurity diffusion region; a plurality of first electrodes electrically connected to the first impurity diffusion regions; variable resistance layers electrically connected to the first electrodes, and a plurality of second electrodes electrically connected to the variable resistance layers. Among the plurality of first electrodes and the plurality of second electrodes, an array direction of two electrodes of one thereof forming pairs with one electrode of another thereof is not parallel with a direction of extension of the active regions.

The meritorious effects of the present invention are summarized as follows.

According to the present invention it is possible to obtain a highly integrated nonvolatile memory device.

BRIEF DESCRIPTIONS OF THE DRAWINGS

PREFERRED MODES

Figure 1:
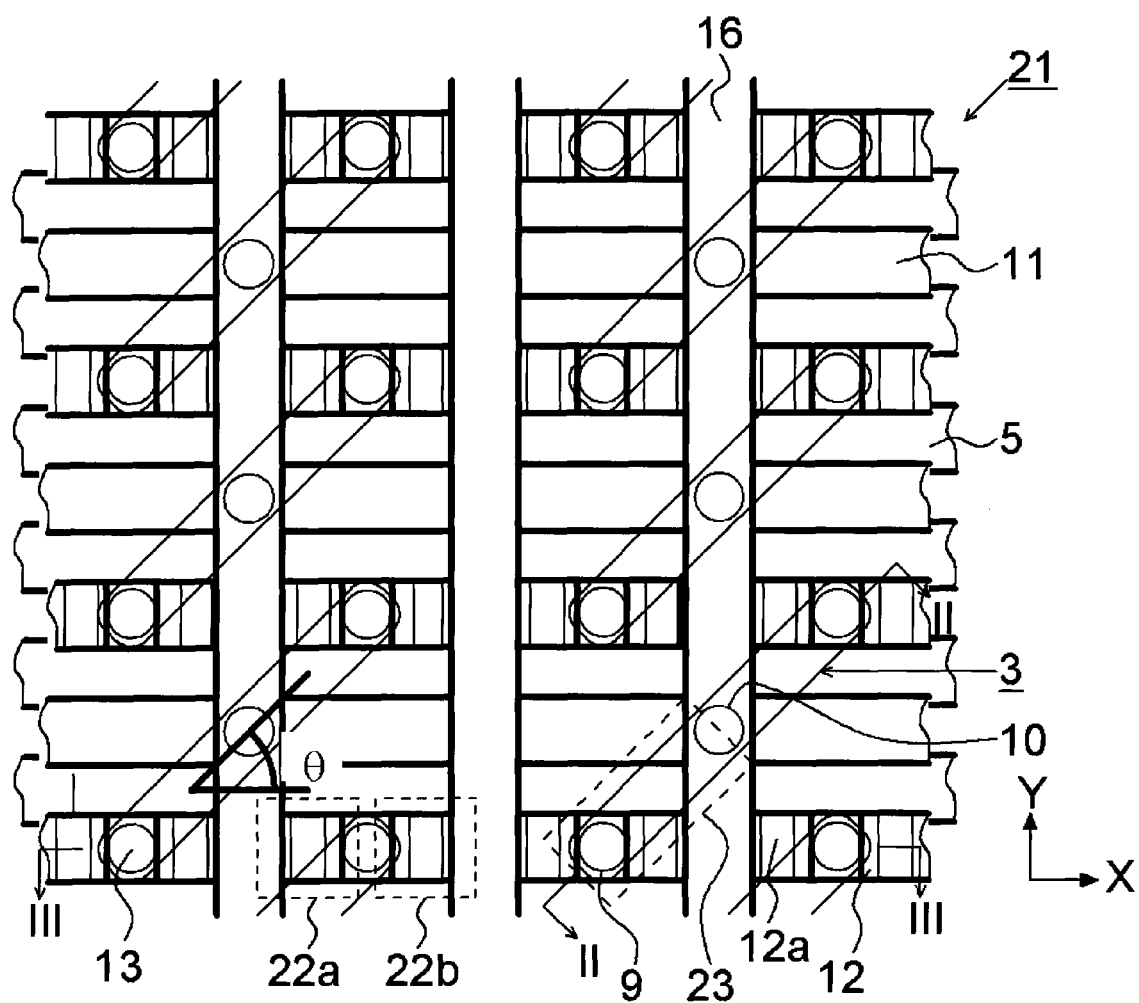
FIG. 1 is a schematic plan view of a phase change memory device according to a first exemplary embodiment of the present invention.

Preferred exemplary embodiments of the present invention are described below.

According to a preferred exemplary embodiment of a first aspect as described above, an active region extends in a band on a semiconductor substrate.

According to a preferred exemplary embodiment of the first to third aspects as described above, among first electrodes and second electrodes, two variable resistance layers are electrically connected to at least one electrode thereof.

According to a preferred exemplary embodiment of the first to the third aspects as described above, a plurality of variable resistance layers, and a plurality of first electrodes and a plurality of second electrodes electrically connected to the variable resistance layers form a plurality of variable resistance layer—electrode arrays arranged such that the first electrodes and the second electrodes are staggered, through the variable resistance layers.

According to a preferred exemplary embodiment of the first to the third aspects as described above, the variable resistance layer—electrode array extends in parallel to a semiconductor substrate surface.

According to a preferred exemplary embodiment of the first to the third aspects as described above, at least a portion of the variable resistance layer—electrode array is not parallel to an active region, as viewed in a plan projection of the semiconductor substrate.

According to a preferred exemplary embodiment of the first to the third aspects as described above, the variable resistance layer—electrode array has a linear form, as viewed in a plan projection of the semiconductor substrate.

According to a preferred exemplary embodiment of the first to the third aspects as described above, the variable resistance layer—electrode array has a zigzag form, as viewed in a plan projection of the semiconductor substrate.

According to a preferred exemplary embodiment of the first to the third aspects as described above, two first impurity diffusion regions formed in one active region are respectively electrically connected to different variable resistance layer—electrode arrays.

According to a preferred exemplary embodiment of the first to the third aspects as described above, the first electrodes overlap at least a portion of the first impurity diffusion regions, as viewed in a plan projection of the semiconductor substrate.

According to a preferred exemplary embodiment of the first to the third aspects as described above, the nonvolatile memory device is further provided with bit lines. The second electrodes overlap at least a portion of the bit lines, as viewed in a plan projection of the semiconductor substrate.

According to a preferred exemplary embodiment of the first to the third aspects as described above, select active elements additionally have a gate electrode forming a word line. One active region intersects with two gate electrodes.

According to a preferred exemplary embodiment of the first to the third aspects as described above, in one active region the first impurity diffusion regions are formed on each of two edges of the active region.

According to a preferred exemplary embodiment of the first to the third aspects as described above, the first impurity diffusion regions are arranged in a lattice form on the semiconductor substrate.

According to a preferred exemplary embodiment of the first to the third aspects as described above, plural active regions are arranged along one bit line of either among two adjacent bit lines.

According to a preferred exemplary embodiment of the first to the third aspects as described above, an angle among angles specified below is 25° to 110°. That is, (a) an angle formed by an array direction of a first electrode and a second electrode in at least one memory part among a plurality of memory parts and an array direction of the first impurity diffusion regions and the second impurity diffusion regions, (b) an angle formed by an array direction of at least one pair of a first electrode and a second electrode that are electrically connected to the same variable resistance layer and a direction of extension of the active regions, or (c) an angle formed by an array direction of, among a plurality of first electrodes and a plurality of second electrodes, two electrodes of one thereof forming pairs with one electrode of another thereof, and a direction of extension of the active regions, is 25° to 110°.

According to a preferred exemplary embodiment of the first to the third aspects as described above, the variable resistance layers are phase change layers having a phase change material.

First Exemplary Embodiment

A description is given below concerning a nonvolatile memory device and a manufacturing method therefor according to the present invention, taking as an example a lateral phase change memory device that uses a phase change material as a variable resistance material, and a manufacturing method therefor.

Figure 2:
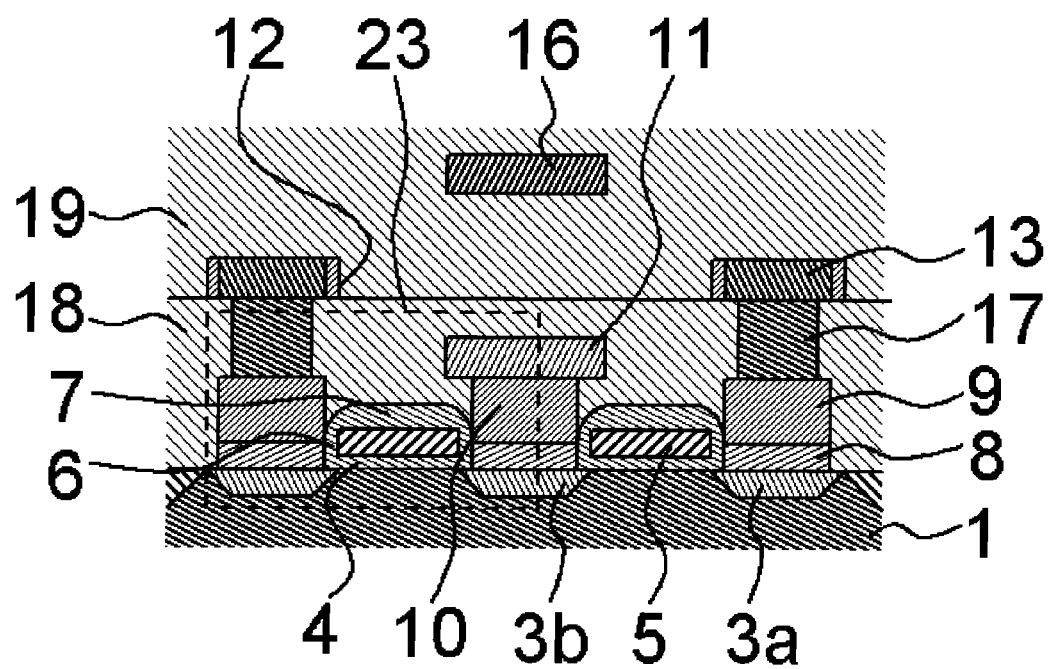
FIG. 2 is a schematic cross-sectional view alone a line II-II in FIG. 1.
Figure 3:
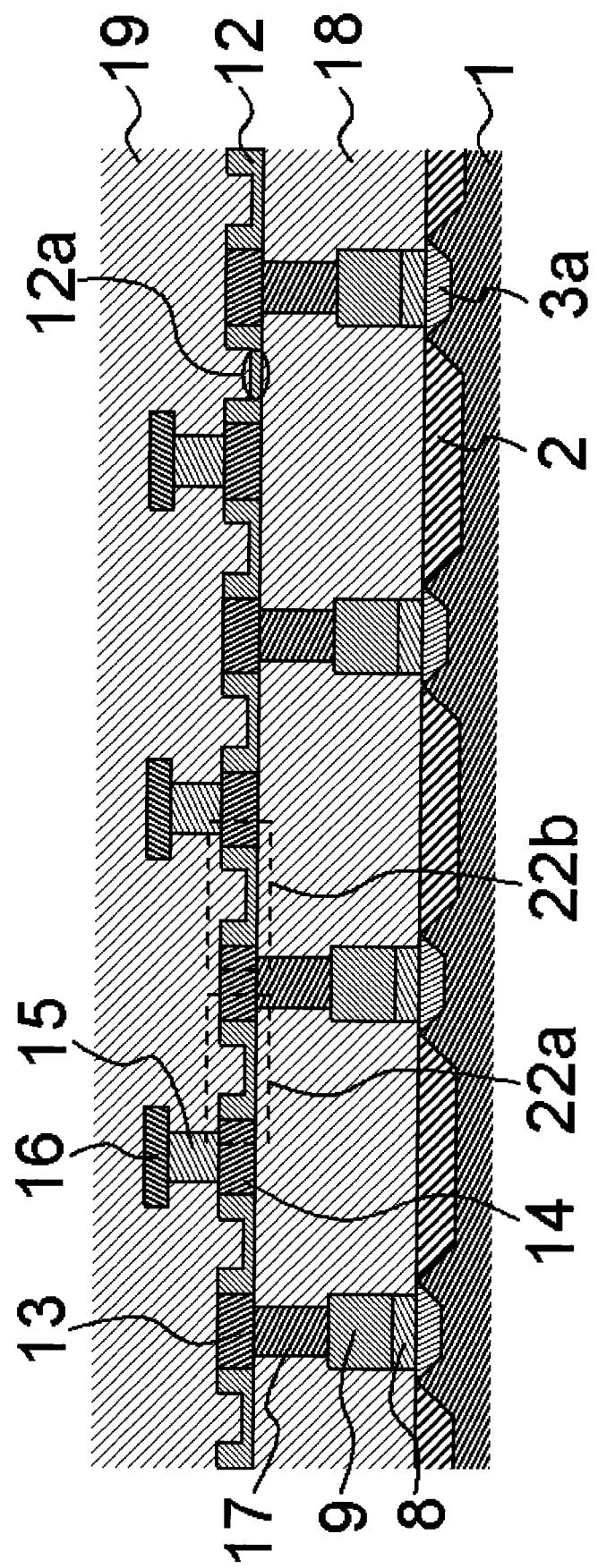
FIG. 3 is a schematic cross-sectional view alone a line III-III in FIG. 1.

A description is given concerning the phase change memory device according to a first exemplary embodiment. FIG. 1 shows a schematic plan view (an upper plan outline projection view of a semiconductor substrate) of the phase change memory device according to the first exemplary embodiment of the present invention. FIG. 2 shows a schematic cross-sectional view at a line II-II in FIG. 1 along a direction of extension of an active region 3, and FIG. 3 shows a schematic cross-sectional view at a line III-III in FIG. 1 along a direction of extension of a word line (gate electrode) 5. In FIG. 1, a side wall 6 and a gate electrode protection insulating film 7 of the gate electrode 5, a bit line contact 15, a lower insulating layer 18, and an upper insulating layer 19 are omitted from the drawing, and in order to show positions of the active region 3, a cell contact 9, and a ground line contact 10 in a lower layer, elements thereof are shown by thin lines.

The phase change memory device (nonvolatile memory device) 21 is provided with a plurality of memory parts 22 and a plurality of select transistors (select active elements) 23.

A select transistor 23 is provided with a first impurity diffusion region 3a and a second impurity diffusion region 3b, a gate insulating film 4, and a gate electrode 5, formed in the active region 3 of the semiconductor substrate 1.

The memory part 22 is provided with a phase change layer (variable resistance layer) formed on the lower insulating layer 18, and a first electrode 13 and a second electrode 14 electrically connected to the phase change layer 12. The first electrode 13 and the second electrode 14 are disposed alternately and consecutively, through (with intervening) the phase change layer 12. That is, two phase change layers 12 are electrically connected respectively to one first electrode 13 and one second electrode 14.

The first electrode 13 is electrically connected to the first impurity diffusion region, through a contact plug 17, the cell contact 9 and a lower contact 8. The second electrode 14 is electrically connected to a bit line 16 via the bit line contact 15. The second impurity diffusion region 3b is electrically connected to a ground line 11 via the lower contact 8 and the ground line contact 10.

The first electrode 13, in a plan projection shown in FIG. 1, preferably overlaps with at least a part of the first impurity diffusion region 3a (for example, a drain region) of the active region 3 formed in the semiconductor substrate 1, and more preferably is arranged above (preferably directly above) the first impurity diffusion region 3a. The second electrode 14, in the upper surface projection shown in FIG. 1, preferably overlaps with at least a part of the bit line 16, and more preferably is arranged below (preferably directly below) the bit line 16.

The phase change layer 12 has a phase change region (variable resistance region) 12a, into which current is injected by the first electrode 13 and the second electrode 14, and whose phase changes by self-generated heat by this current. The first electrode 13 and the second electrode 14, which supply current to the phase change layer 12, are electrically connected to the phase change layer 12, but are not directly connected to the phase change region 12a. In the present exemplary embodiment, the phase change region 12a forms a base of a channel formed in the phase change layer 12 along a direction (a direction Y in FIG. 1) perpendicular to a line (a direction X in FIG. 1) joining the first electrode 13 and the second electrode 14.

In the phase change region 12a, a cross-sectional area of a cross section perpendicular to direction of current flow thereof is preferably small, in order that the phase change is done rapidly and with low power. For example, the phase change region 12a can be formed as either or both of: a thinnest region and a slenderest region in the phase change layer 12. On the other hand, the phase change layer 12 outside of the phase change region 12a preferably has a cross-sectional area larger than the cross-sectional area of the phase change region 12a so as not to have high resistance. Volume of the phase change region 12a is set so that information can be written with desired power and at desired speed. Furthermore, layer thickness of the phase change region 12a is preferably uniform. For example, the thickness of the phase change region 12a can be 1 nm to 50 nm.

With regard to material of the phase change layer 12, it is possible to use a material having two of more phase states in accordance with temperature and in which electrical resistance differs according to the phase state, such as a chalcogenide material, for example. A chalcogen element is an element belonging to the 16th group of the periodic table, and indicates sulphur (S), selenium (Se), or tellurium (Te). Generally, chalcogenide material is a compound including at least one element of germanium (Ge), tin (Sn), and antimony (Sb), together with at least one chalcogen element. Here, it is possible to use a material in which an element such as nitrogen (N), oxygen (O), copper (Cu), aluminum (Al), or the like, is added. Examples include binary compounds such as GaSb, InSb, InSe, $Sb_2Te_3$, GeTe, or the like, ternary compounds such as $Ge_2Sb_2Te_5$, InSbTe, GaSeTe, $SnSb_2Te_4$, InSbGe, or the like, or quaternary compounds such as AgInSbTe, (GeSn) SbTe, GeSb(SeTe), $Te_{81}Ge_{15}Sb_2S_2$, or the like. Here, F is a minimum processing dimension (a value of half of a word line spacing within a cell)

Figure 10A:
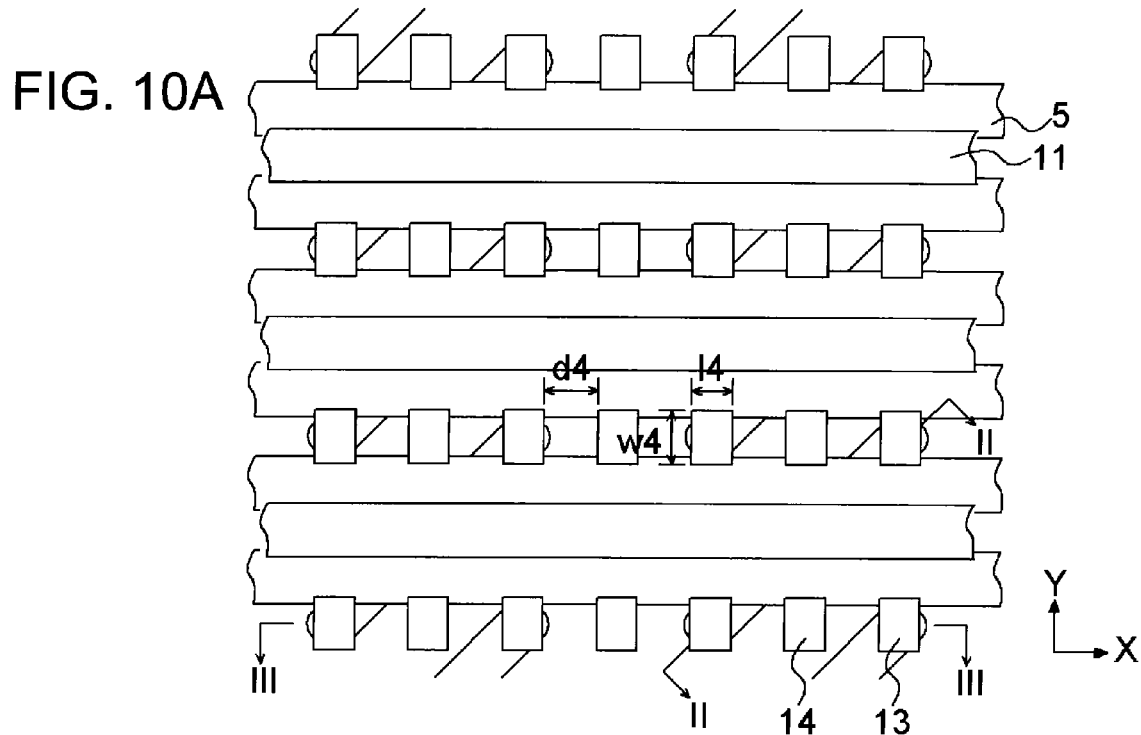
FIGS. 10A to 10C show a schematic process diagram of a method of manufacturing the phase change memory device according to the first exemplary embodiment of the present invention.

FIG. 10A is a schematic planar view of a state in which the first electrode 13 and the second electrode 14 are formed. The first electrode 13 and the second electrode 14 preferably have a quadrilateral shape in the upper surface view shown in FIG. 10A, and more preferably have a rectangular shape. Length l4 (length in a direction in which the gate electrode 5 extends (an X direction shown in FIG. 1)) of the first electrode 13 and the second electrode 14 is preferably 0.5 F to 1.5 F. Width w4 (width in a direction in which the bit line 16 extends (a Y direction shown in FIG. 1)) of the first electrode 13 and the second electrode 14 is preferably 0.5 F to 1.5 F. Furthermore, distance d4 between an adjacent first electrode 13 and second electrode 14 is preferably 0.5 F to 3 F.

With regard to the material of the first electrode 13 and the second electrode 14, a well known electrode material can be used, without any particular limitation. For example, it is possible to use titanium (Ti), tantalum (Ta), molybdenum (Mo), niobium (Nb), zirconium (Zr), tungsten (W), or metal nitrides thereof, or a silicide compound including metals thereof and nitrides thereof. In addition, it is possible to use an alloy including the abovementioned metals. A compound of a nitride or silicide forming the electrode material need not be in a stoichiometric proportion. Furthermore, it is possible to add an impurity such as carbon (C) to the electrode material.

In the outline planar view shown in FIG. 1, a plurality of phase change layers 12, and a plurality of first electrodes 13 and second electrodes 14 electrically connected to the phase change layers 12 form a plurality of arrays (referred to below as "phase change layer—electrode array") in which the first electrodes 13 and the second electrodes 14 are arrayed in a staggered and consecutive manner, through the phase change layers 12. The phase change layer—electrode arrays are disposed to form the same layer, and are preferably disposed in parallel to a surface of the semiconductor substrate 1. Furthermore, at least a portion of the phase change layer—electrode arrays is not parallel to the active region 3, in the upper surface projection shown in FIG. 1. In the present exemplary embodiment, the phase change layer—electrode arrays are formed linearly. The phase change layer—electrode arrays, gate electrodes (word lines) 5 of the select active elements 23 forming word lines, and linear ground lines 11 extend in parallel in one direction (X direction in FIG. 1). The plurality of phase change layer—electrode arrays and the ground lines 11 are alternately arrayed, and the gate electrodes 5 are respectively disposed between the phase change layer—electrode arrays and the ground lines 11. The bit lines 16 are preferably arrayed to be orthogonal to the gate electrodes 5. Furthermore, the bit lines 16 and the gate electrodes 5 are preferably arrayed to be respectively at equally spaced intervals.

With regard to the phase change layer—electrode arrays in the present exemplary embodiment, the phase change layers 12 are separated for each phase change region 12a, and side faces of the phase change layers 12 and the first electrodes 13 and second electrodes 14 are in electrical contact and are disposed to form the same layer, but in another embodiment, plural first electrodes 13 and second electrodes 14 may be electrically connected to a lower surface or an upper surface of the phase change layers 12 that have the plurality of phase change regions 12a.

Figure 4A:
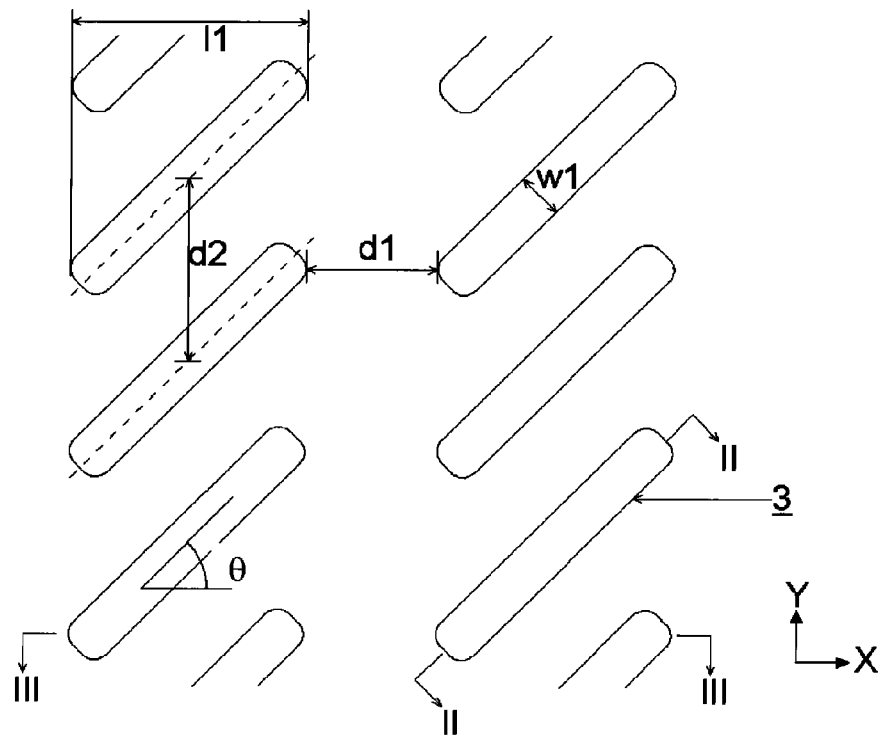
FIGS. 4A to 4C show a schematic process diagram of a method of manufacturing the phase change memory device according to the first exemplary embodiment of the present invention.

FIG. 4A shows a schematic planar view of a state in which an active region 3 is formed in the semiconductor substrate 1. The active region 3 is set in a band form by element separation regions 2 in the semiconductor substrate 1. The active region 3 is formed so as not be parallel to a direction of extension of at least a portion of the phase change layer—electrode array, the gate electrodes 5 and the ground lines 11. For example, in the upper surface view shown in FIG. 1, an angle θ between a direction of extension of the active region 3 (for example, a direction of extension of a bisector of the active region 3) or an array direction of the first impurity diffusion region 3a and the second impurity diffusion region 3b, and an array direction of (or a line joining centers of gravity of each of) a pair of a first electrode 13 and second electrode 14 electrically connected to the same phase change layer 12 or an array direction of a dotted line shape of the first electrode 13 or the second electrode 14 in one phase change layer—electrode array, is not 0° nor 180°. The angle θ is preferably 25° to 155°. In a case where the phase change layer—electrode array is linear, as in the present exemplary embodiment, the angle θ is preferably 25° to 65° or 115° to 155°, and more preferably is 45° or 135°. Furthermore, in the present exemplary embodiment, since the direction of extension of the phase change layer—electrode array and the direction of extension of the gate electrodes 5 are parallel, the angle θ corresponds to an angle formed by the direction of extension of the active region 3 and the direction of extension of the gate electrodes 5.

In the present exemplary embodiment, one active region 3 intersects with two of the gate electrodes 5. In one the active region 3, first impurity diffusion regions 3a are formed on either edge, and a second impurity diffusion region 3b (for example, a source electrode) is formed in the center. The two first impurity diffusion regions 3a on the two edges of the one active region 3 are each electrically connected to different phase change layer—electrode arrays. In the one active region 3, using the two intersecting gate electrodes 5 and the two first impurity diffusion regions 3a and the second impurity diffusion region 3b, two select transistors 23 are formed so as to share the second impurity diffusion region 3b.

A plurality of active regions 3 are formed to be respectively parallel, are regularly arrayed along a direction of extension of the bit lines 16 (every other line), and are regularly arrayed along a direction of extension of the gate electrodes 5. In FIG. 1 to FIG. 3, the first impurity diffusion regions 3a (or the cell contacts 9) are regularly arrayed in a lattice form on the semiconductor substrate 1.

Width w1 of the active region 3 is preferably 0.5 F to 2 F. Length l1 in an X direction of the active region 3 is preferably 3 F to 6 F. Distance d1 between two adjacent active regions in an X direction is preferably 1 F to 4 F. Distance d2 between two adjacent active regions 3 in a direction of extension of the bit lines 16 (Y direction shown in FIG. 1) is preferably 2.5 F to 6 F.

Figure 5A:
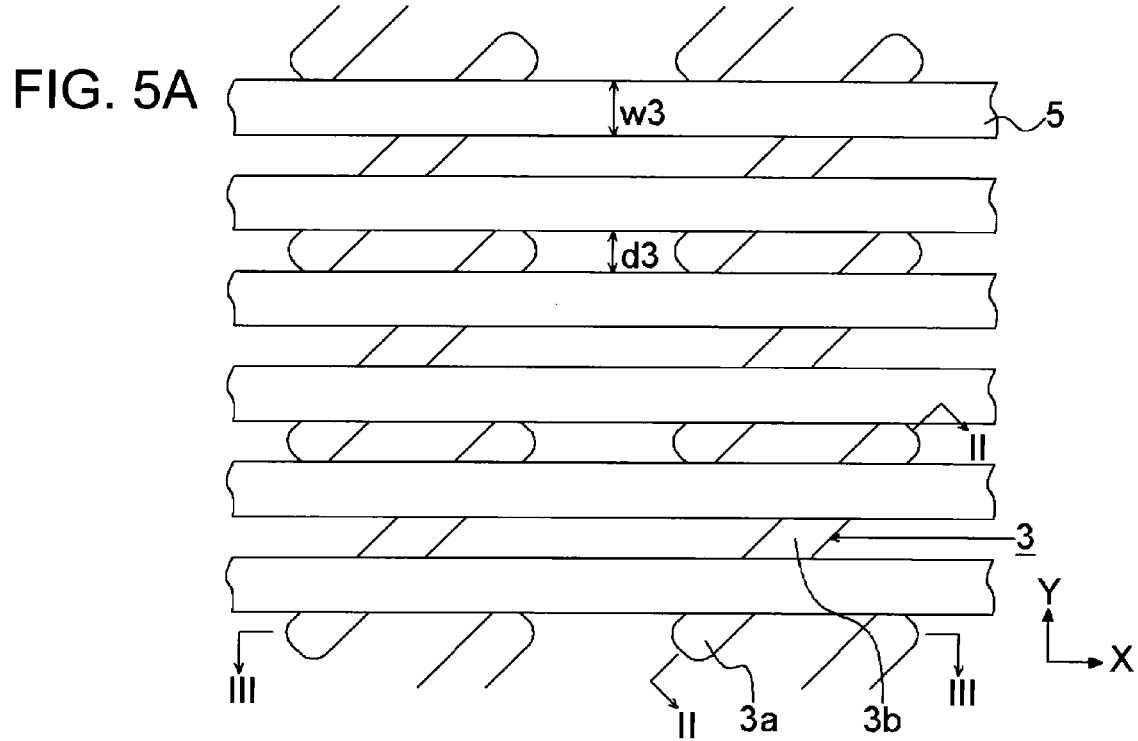
FIGS. 5A to 5C show a schematic process diagram of a method of manufacturing the phase change memory device according to the first exemplary embodiment of the present invention.

FIG. 5A shows a schematic planar view of a state in which the gate electrodes (word lines) 5 are formed on the semiconductor substrate 1. Width w3 of the gate electrodes 5 is preferably 0.5 F to 2 F. Furthermore, distance d3 between two adjacent gate electrodes 5 is preferably 0.5 F to 2 F.

Each impurity diffusion region 3a is electrically connected, through one first electrode 13, to two phase change layers 12 adjacent to the first electrode 13 in question. That is, two memory parts 22a and 22b can share one select transistor 23 and first electrode 13.

According to the present invention, it is possible to configure the two memory parts 22a and 22b in a region of 4 F×4 F, for example. That is, in the lateral phase change memory device 21, it is possible to realize a cell size of substantially 8 $F^2$. Furthermore, in the present invention, plural gate electrodes (word lines) 5 and plural bit lines 16 are each arrayed at equal intervals, and in addition, the gate electrodes (word lines) 5 and the bit lines 16 are orthogonal. In this way, peripheral circuits can be efficiently disposed, and it is possible to realize high integration of the phase change memory device 21.

When the select transistor 23 is shared, in a case where a resistance value of the memory part 22 is low in comparison to an ON resistance of the select transistor 23, a bit line that is not selected may be in an electrically open state. For example, if a bit line that is not selected is in a grounded state, a closed circuit is formed between a selected bit line→selected cell→non-selected cell→non-selected bit line, unnecessary current flows, and a property when reading information or writing information deteriorates, but by having the non-selected bit line in an open state, this type of problem is avoided. Furthermore, if the select transistor 23 is not shared (another memory part is not formed), the abovementioned problem can be avoided, but in this case cell integration level is about 16 $F^2$.

Next, a description is given concerning a method of manufacturing the phase change memory device according to the first exemplary embodiment of the present invention. FIG. 4A to FIG. 12C show outline process drawings of the method of manufacturing the phase change memory device according to the first exemplary embodiment of the present invention shown in FIG. 1 to FIG. 3. FIG. 4A to FIG. 12A are outline planar views of portions corresponding to a plane shown in FIG. 1; FIG. 4B to FIG. 12B are outline cross-sectional views of portions corresponding to the cross-section II-II shown in FIG. 1; and FIG. 4C to FIG. 12C are outline cross-sectional views of portions corresponding to the cross-section III-III shown in FIG. 1. Furthermore, in FIG. 4A to FIG. 12A, the side wall 6 and the gate electrode protection insulating film 7 of the gate electrode 5, a lower insulating layer 18, and an upper insulating layer 19 are omitted from the drawings.

Figure 4B:
Figure 4C:
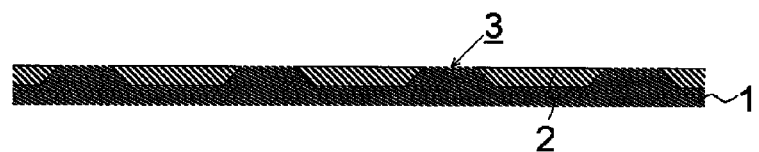

First, an element separation region 2 is formed by a method such as STI (Shallow Trench Isolation) or the like on the semiconductor substrate 1 (for example, a p-type silicon substrate), and in this way a plurality of the active regions 3 are formed in a band (FIGS. 4A to 4C).

Figure 5B:
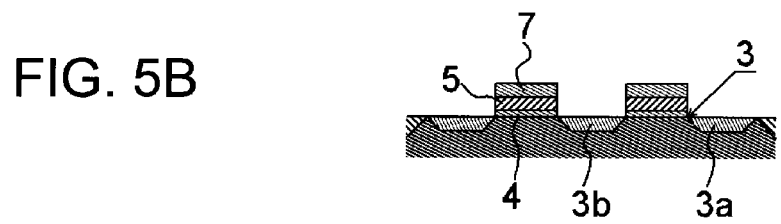
Figure 5C:
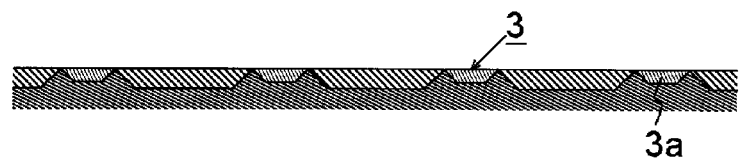

Next, a plurality of gate insulating films 4, gate electrodes (word lines) 5, and gate electrode protection insulating films 7 are formed along the X direction, on the semiconductor substrate 1, and in addition, the first impurity diffusion regions 3a and the second impurity diffusion regions 3b are formed on the active regions 3 (FIGS. 5A to 5C). The gate insulating films 4, the gate electrodes (word lines) 5, the gate electrode protection insulating films 7, the first impurity diffusion regions 3a, and the second impurity diffusion regions 3b can be formed, for example, by a method as follows. First, a layer that forms a base of a gate insulating film 4 is formed on the entire upper surface of the semiconductor substrate 1. Next, a polysilicon film, a tungsten silicide film, a tungsten film, and a tungsten nitride film, forming a base of the gate electrodes 5, are deposited sequentially on a layer forming a base of the gate insulating film 4. In addition, deposited on this is a layer that forms a base of the gate electrode protection insulating film 7 (for example, a silicon nitride film). Next, by patterning this layered stack in a linear form, the gate insulating film 4, the gate electrode (word line) 5, and the gate electrode protection insulating film 7 are formed. Next, an impurity (for example, boron (B) or the like) is injected to the active region 3 by an ion injection method or the like, and the first impurity diffusion region 3a and the second impurity diffusion region 3b forming a drain electrode and a source electrode of the select transistor 23 are formed.

Figure 6A:
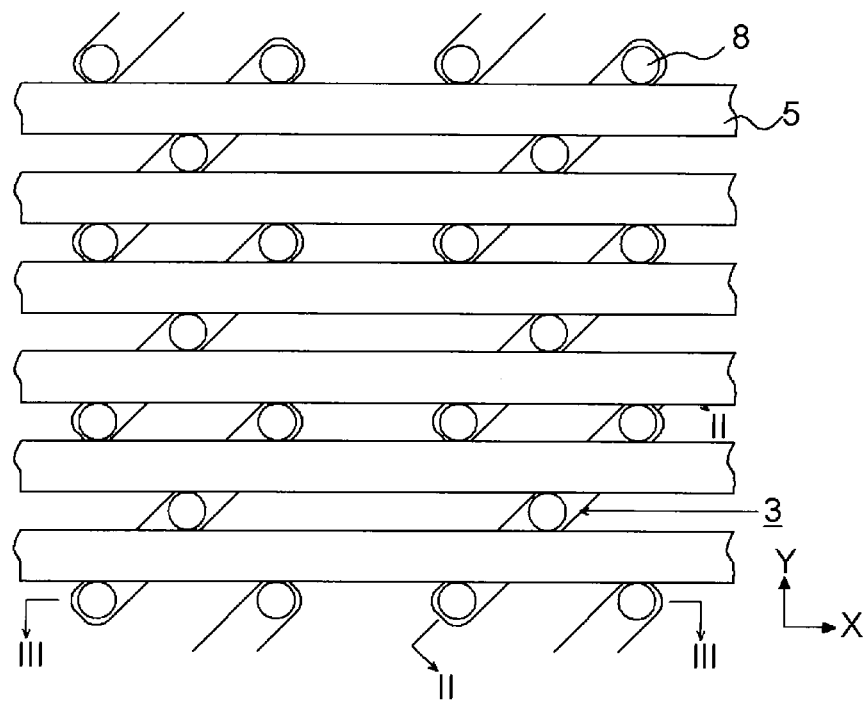
FIGS. 6A to 6C show a schematic process diagram of a method of manufacturing the phase change memory device according to the first exemplary embodiment of the present invention.
Figure 6B:
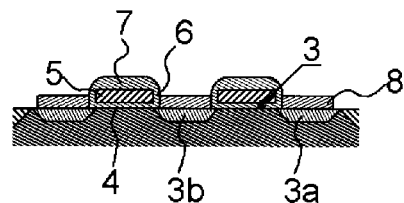
Figure 6C:
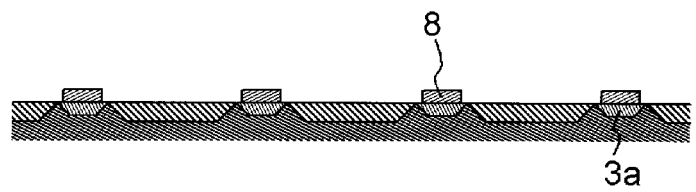

Next, a side wall 6 is formed on both sides of the gate electrode 5, and in addition a lower contact 8 is formed on the first impurity diffusion region 3a and the second impurity diffusion region 3b of the active region 3 (FIGS. 6A to 6C). For example, the side wall 6 can be formed by forming a silicon nitride film having a thickness of about 26 nm on an entire surface and then performing etching thereof. Furthermore, the lower contact 8 can be formed as a silicon epitaxial layer in which Si is epitaxially grown, on the first impurity diffusion region 3a and the second impurity diffusion region 3b.

Figure 7A:
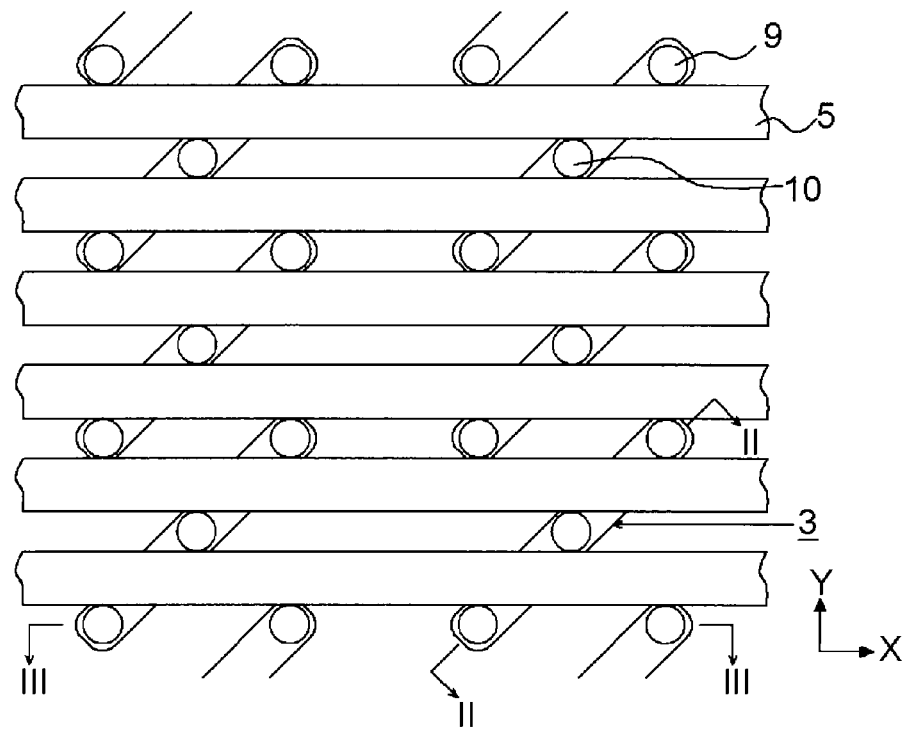
FIGS. 7A to 7C show a schematic process diagram of a method of manufacturing the phase change memory device according to the first exemplary embodiment of the present invention.
Figure 7B:
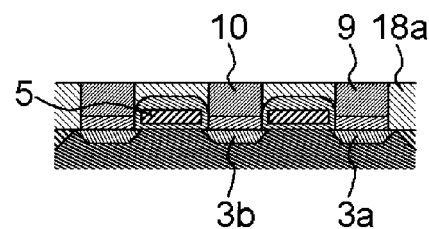
Figure 7C:
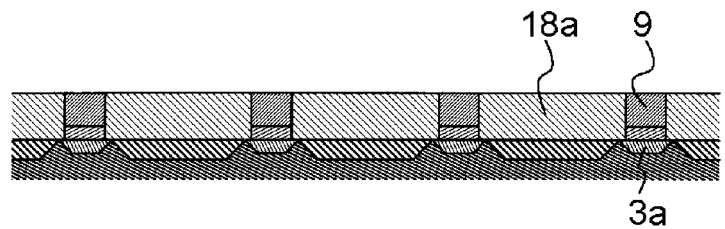

Next, a cell contact 9 is formed on the lower contact 8 on the first impurity diffusion region 3a, and a ground line contact 10 is formed on the lower contact 8 on the second impurity diffusion region 3b (FIGS. 7A to 7C). For example, initially a first lower insulating layer 18a formed from BPSG (Boro-Phospho Silicate Glass) having a prescribed thickness is formed on the entire surface. Next, a contact hole penetrating the first lower insulating layer 18a is formed by etching, using lithography technology, on the lower contact 8. Next, inside of the contact hole is filled with an electrically conductive material, such as DOPOS (Doped Poly-Silicon) or the like. Next, by flattening the deposited DOPOS by CMP or the like, and leaving the DOPOS only inside the contact hole, the cell contact 9 and the ground wire contact 10 are formed.

Figure 8A:
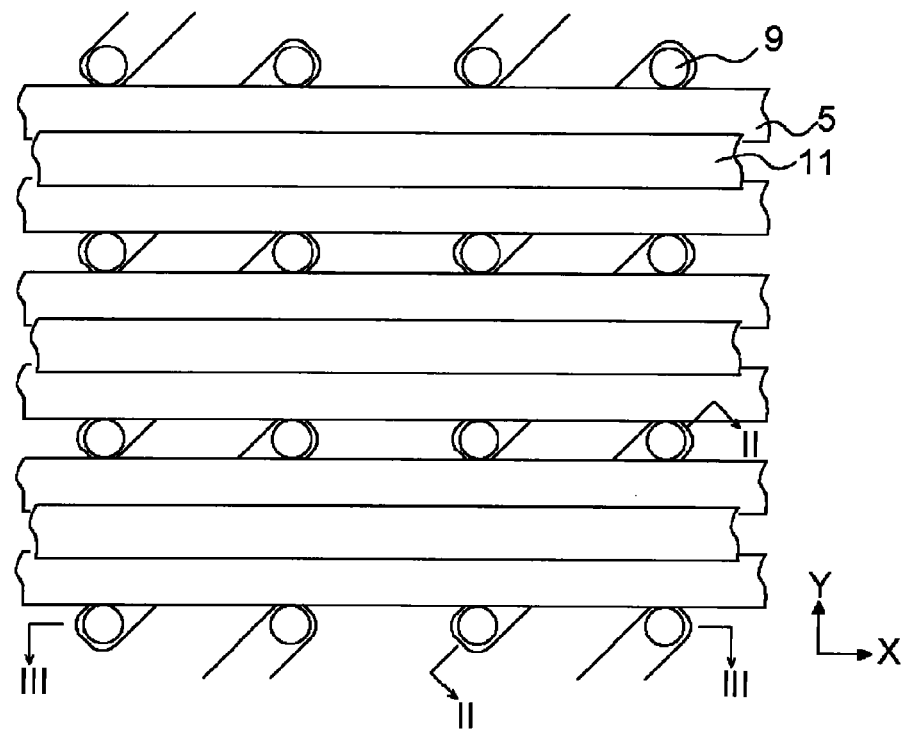
FIGS. 8A to 8C show a schematic process diagram of a method of manufacturing the phase change memory device according to the first exemplary embodiment of the present invention.
Figure 8B:
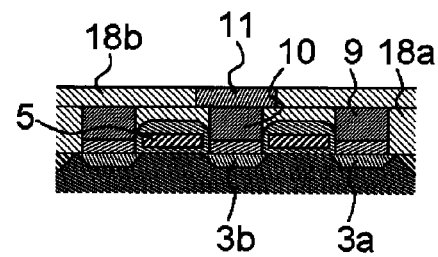
Figure 8C:
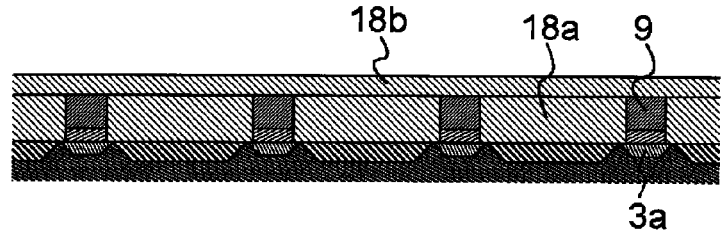

Next, a ground wire 11 is formed on the ground wire contact 10 (FIGS. 8A to 8C). For example, first, a second lower insulating layer 18b is formed from BPSG having a prescribed thickness on the entire surface. Next, using lithography technology, a concave channel is formed in the second lower insulating layer 18b by etching so that the ground wire contact 10 is exposed. Next, material of the ground wire 11 such as tungsten (W) or the like is deposited, and by polishing and flattening by a CMP method or the like, the ground wire 11 is formed.

Figure 9A:
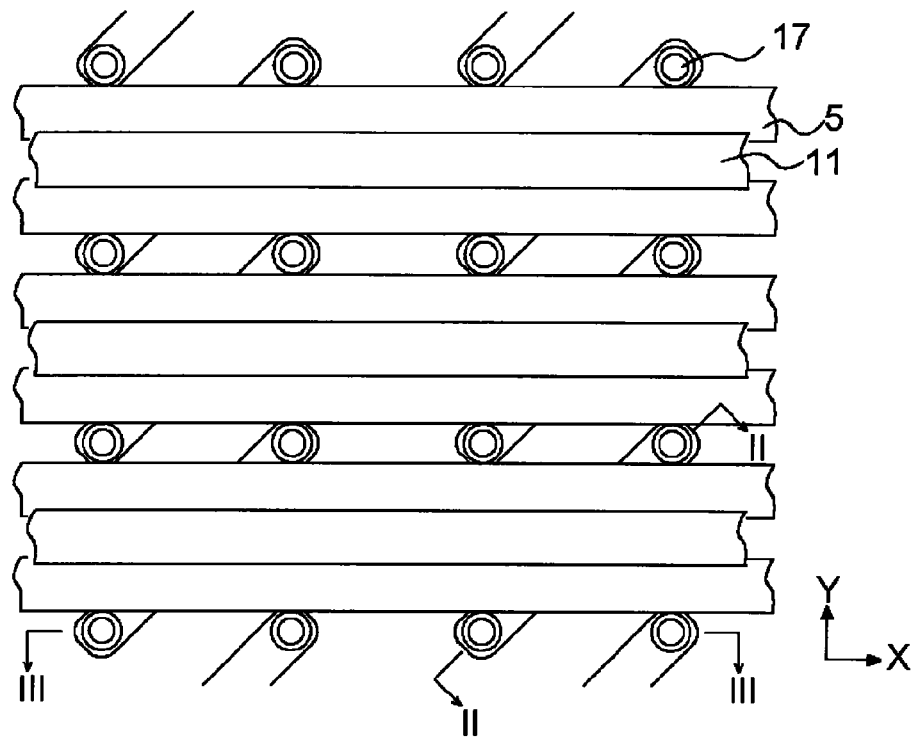
FIGS. 9A to 9C show a schematic process diagram of a method of manufacturing the phase change memory device according to the first exemplary embodiment of the present invention.
Figure 9B:
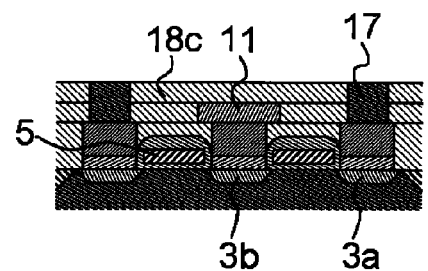
Figure 9C:
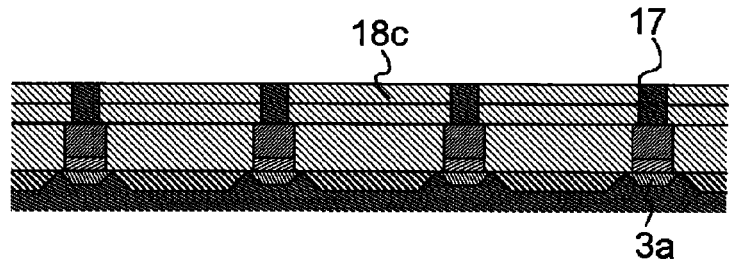

Next, a contact plug 17 is formed in order to electrically connect the first electrode 13 and the first impurity diffusion region 3a (FIGS. 9A to 9C). For example, first, a third lower insulating layer 18c formed from BPSG having a prescribed thickness is formed on the entire surface. Next, using lithography technology, a contact hole penetrating the third lower insulating layer 18c is formed, by etching, so that the cell contact 9 is exposed. Next, by filling the inside of the contact hole with an electrically conductive material, such as tungsten (W) or the like, the contact plug 17 is formed. At this time, the center position of the contact plug 17 and the center position of the cell contact 9 preferably match.

Figure 10B:
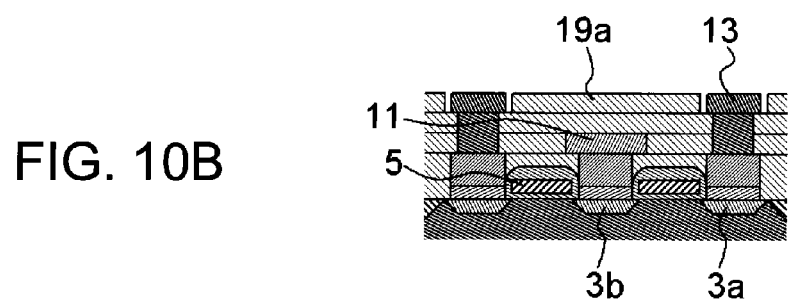
Figure 10C:
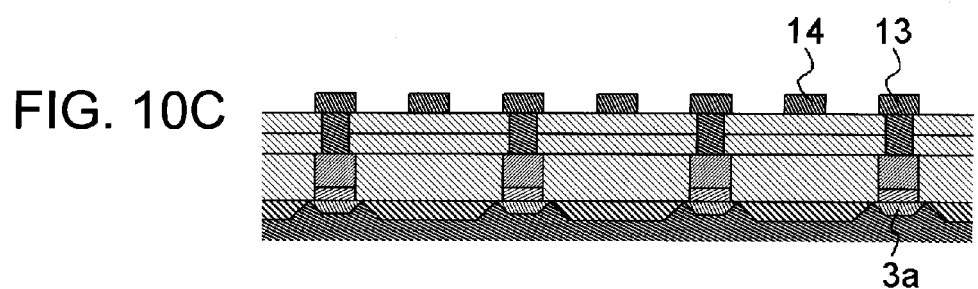

Next, the first electrode 13 is formed on the contact plug 17, and the second electrode 14 is formed at a position that is below the bit line 16 (FIGS. 10A to 10C). For example, initially, a first upper insulating layer 19a formed from BPSG having a prescribed thickness is deposited on the entire surface. Next, using lithography technology, a concave portion is formed at a prescribed position of the first upper insulating layer 19a, by etching. The contact plug 17 is exposed at a position where the first electrode 13 is formed. Next, silicon nitride (SiN) is deposited at this concave portion, and a side wall of silicon nitride is formed by etching. By so doing, it is possible to form a region where an electrode is formed, under a minimum processing dimension F. Next, an electrically conductive material, such as tungsten (W) or the like is deposited in the concave portion by a sputter method or the like. Next, the first electrode 13 and the second electrode 14 are formed by polishing and flattening using a CMP method or the like, so as to have the same height as the first upper insulating layer 19a. Next, using lithography technology, only the first upper insulating layer 19a existing between the first electrode 13 and the second electrode 14 in the X direction is selectively removed by etching.

Figure 11A:
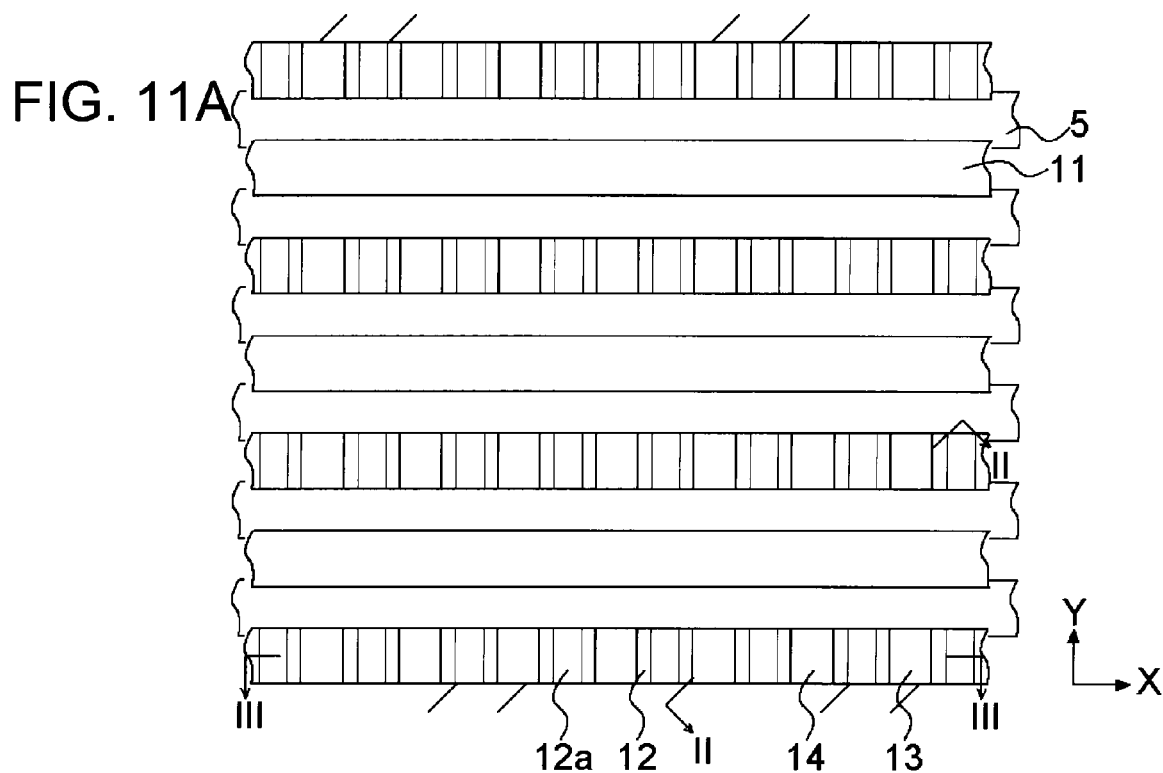
FIGS. 11A to 11C show a schematic process diagram of a method of manufacturing the phase change memory device according to the first exemplary embodiment of the present invention.
Figure 11B:
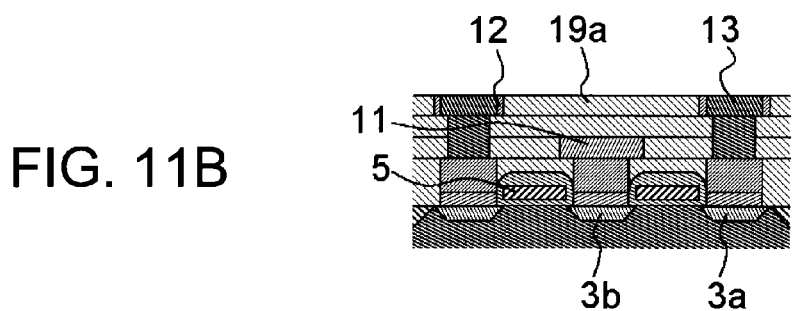
Figure 11C:
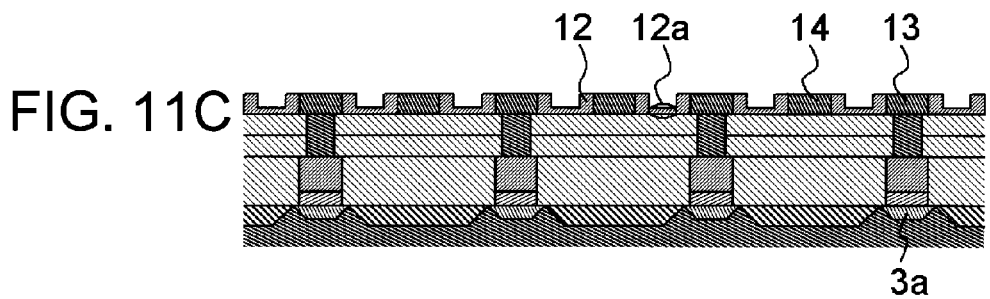

Next, the phase change layer 12 is formed between the first electrode 13 and the second electrode 14 (FIGS. 11A to 11C). For example, material of the phase change layer 12 such as $Ge_2Sb_2Te_5$ or the like is deposited between the first electrode 13 and the second electrode 14. Next, by polishing and flattening the deposited material, by a CMP method or an etching method, the height of the phase change layer 12 and the height of the electrodes 13 and 14 are made the same. Next, using lithography technology, a part of the phase change layer 12 is etched, and a channel is formed extending along a Y direction on the phase change layer 12. Here, a base of the channel of the phase change layer 12 that is made thin forms the phase change region 12a. Width of the phase change layer 12 is preferably the same as the width w4 of the electrodes 13 and 14.

Figure 12A:
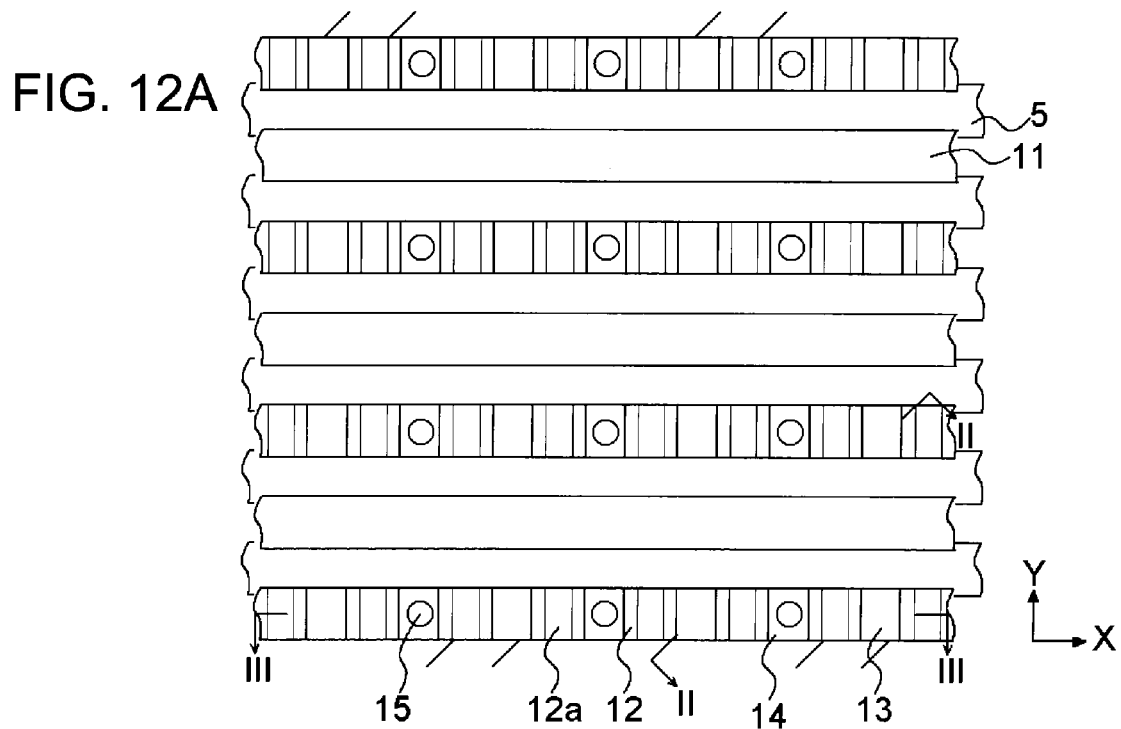
FIGS. 12A to 12C show a schematic process diagram of a method of manufacturing the phase change memory device according to the first exemplary embodiment of the present invention.
Figure 12B:
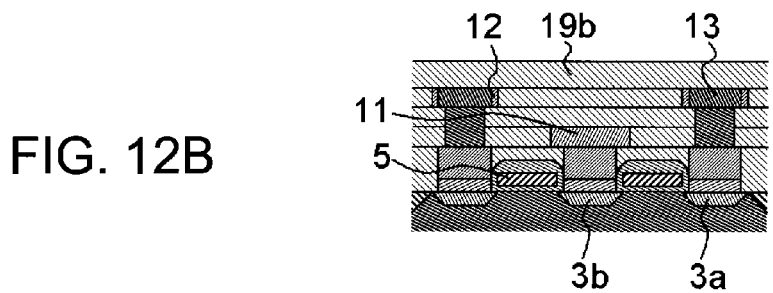
Figure 12C:
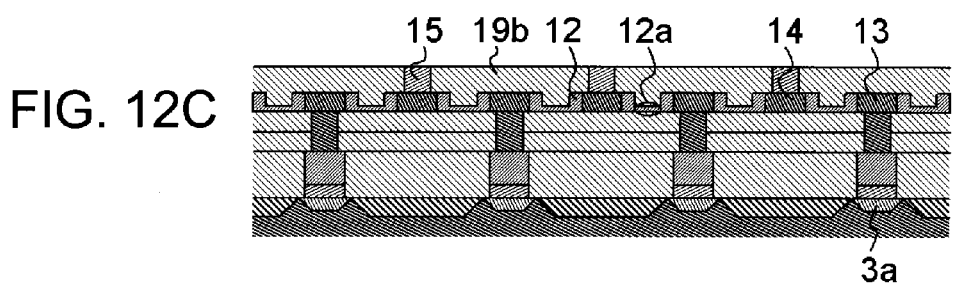

Next, a bit line contact 15 is formed on the second electrode 14 (FIGS. 12A to 12C). For example, first, a second upper insulating layer 19b formed from BPSG having a prescribed thickness is formed on the entire surface. Next, using lithography technology, a through hole is formed by etching in the second electrode 14. Next, an electrically conductive material, such as tungsten (W) or the like, is deposited inside the through hole, and the bit line contact 15 is formed by flattening an upper portion by a CMP method or the like.

Next, the bit line 16 is formed on the bit line contact 15. For example, first, a third upper insulating layer (not shown in the drawings) formed from BPSG having a prescribed thickness is formed on the entire substrate surface. Next, using lithography technology, a concave portion is formed by etching, so that the bit line contact 15 is exposed. Next, by depositing bit line material such as aluminum (Al) or the like, and polishing and flattening by a CMP method or the like, the bit line 16 is formed. Next, by additionally depositing a fourth upper insulating layer (not shown in the drawings) of BPSG or the like, it is possible to manufacture the lateral phase change memory device 21 as shown in FIG. 1 to FIG. 3.

Second Exemplary Embodiment

Figure 13:
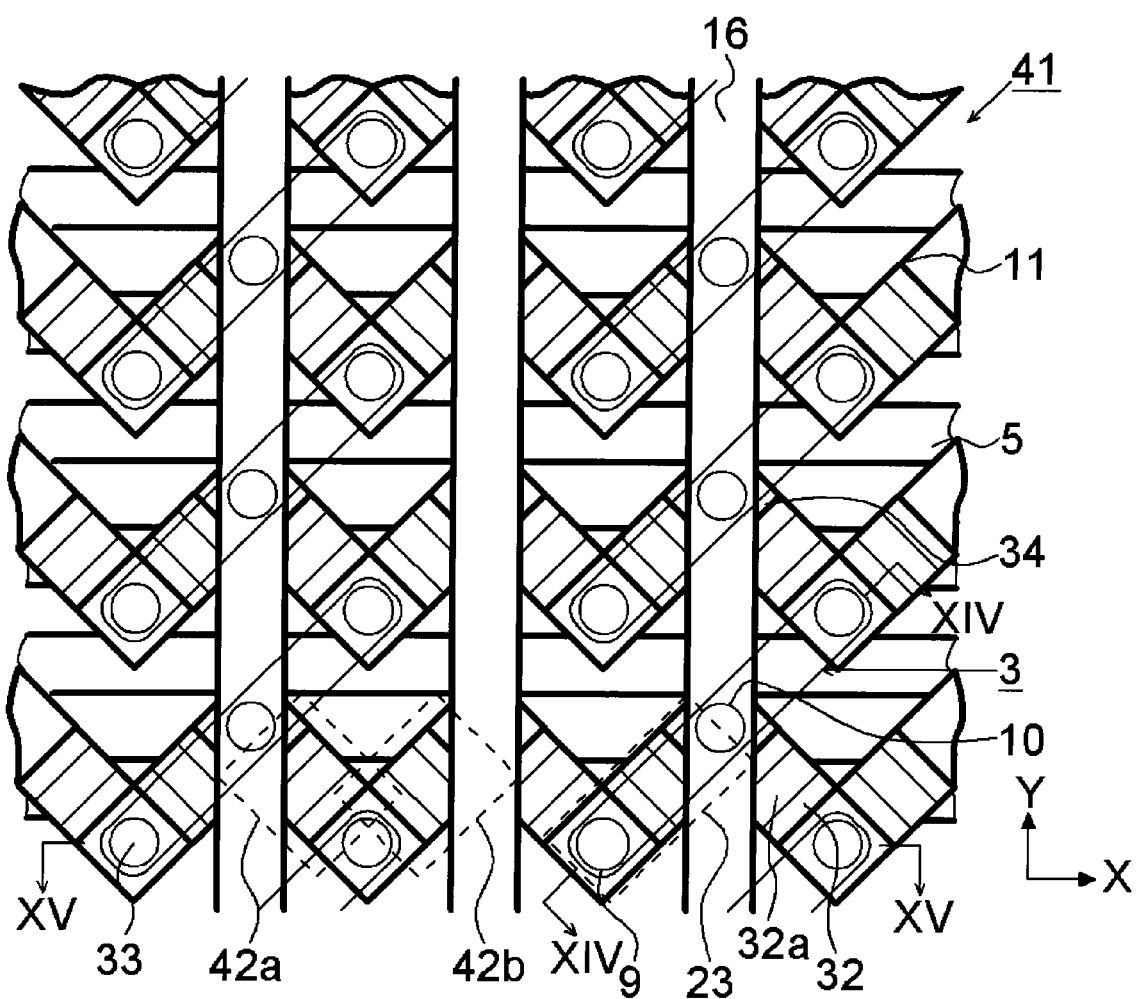
FIG. 13 is a schematic plan view of the phase change memory device according to a second exemplary embodiment of the present invention.
Figure 14:
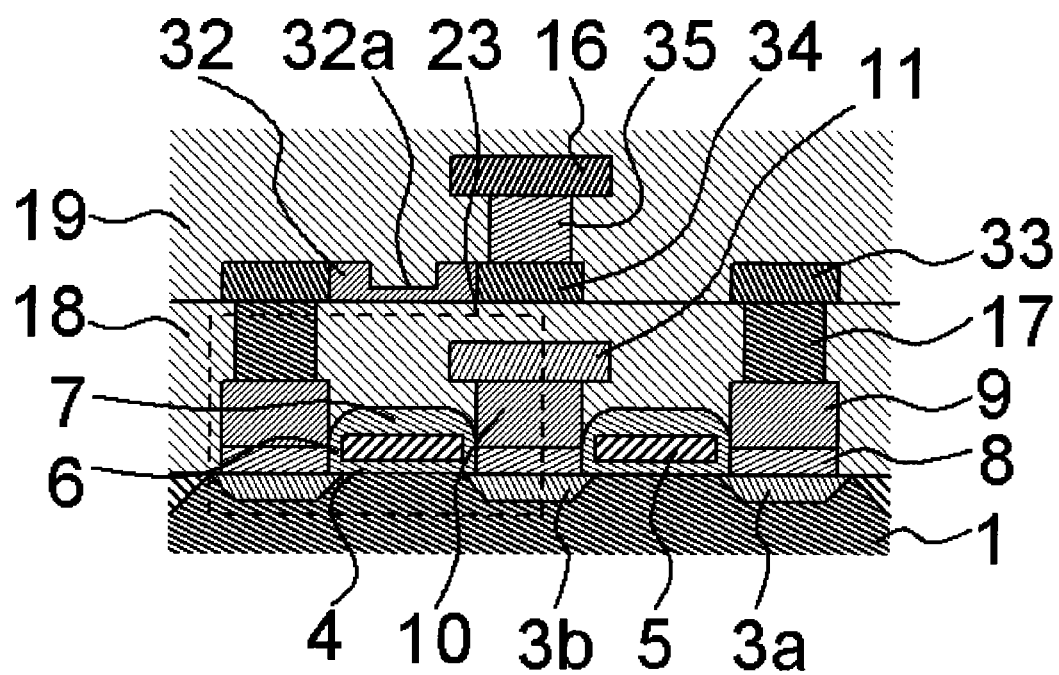
FIG. 14 is a schematic cross-sectional view alone a line XIV-XIV of FIG. 13.
Figure 15:
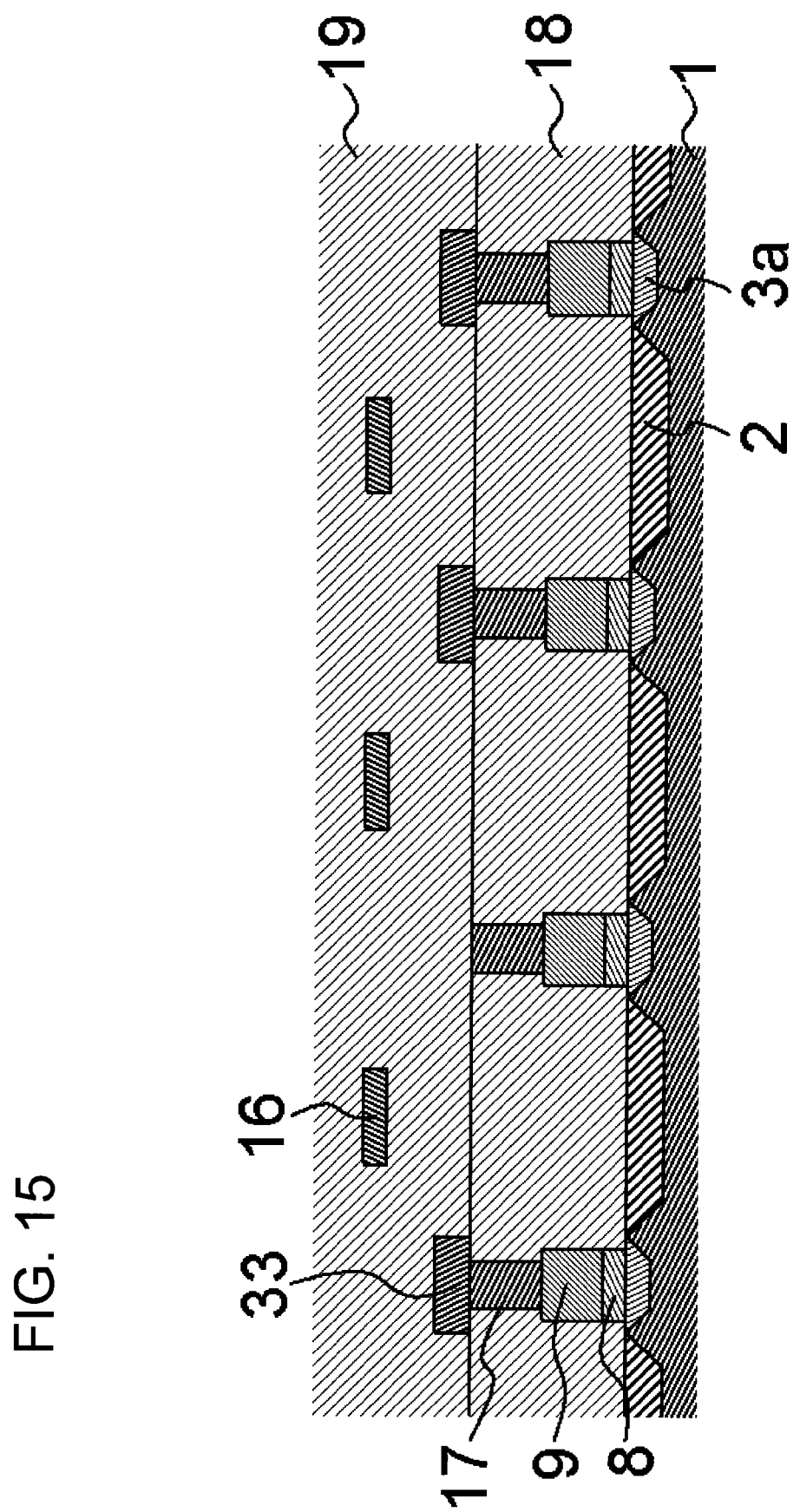
FIG. 15 is a schematic cross-sectional view alone a line XV-XV of FIG. 13.

Next, a description is given concerning a phase change memory device according to a second exemplary embodiment of the present invention. FIG. 13 shows a schematic planar view (an upper surface outline projection view of a semiconductor substrate) of the phase change memory device according to the second exemplary embodiment of the present invention. FIG. 14 shows a schematic cross-sectional view corresponding to a line XIV-XIV in FIG. 13 along a direction of extension of an active region 3, and FIG. 15 shows a schematic cross-sectional view corresponding to a line XV-XV in FIG. 13 along a direction of extension of a word line (gate electrode) 5. In FIG. 13 to FIG. 15, the same reference symbols are given to the same elements as in the first exemplary embodiment. In FIG. 13, a side wall 6 and a gate electrode protection insulating film 7 of the gate electrode 5, a lower insulating layer 18, and an upper insulating layer 19 are omitted from the drawing; and in order to show positions of the active region 3, a cell contact 9, and a ground line contact 10 in a lower layer, elements thereof are shown by thin lines.

With regard to an upper surface projection as shown in FIG. 13, in the first exemplary embodiment, a phase change layer—electrode array formed of phase change layers, first electrodes and second electrodes, extends linearly parallel to gate electrodes, but in the present exemplary embodiment two adjacent phase change layers 32 and a first electrode 33 or a second electrode 34 sandwiched therebetween form an L shape, and the phase change layer—electrode array extends in a zigzag shape along the gate electrodes 5. The first electrode 33 that is electrically connected to a first impurity diffusion region 3a is arranged above (preferably directly above) the first impurity diffusion region 3a, similarly to the first exemplary embodiment. In this way, plural first electrodes 33 in one phase change layer—electrode array are arrayed linearly, and also are arrayed in parallel to the gate electrodes 5 (X direction). In the same way, a plurality of second electrodes 34 and phase change layers 32 in one phase change layer—electrode array are arrayed linearly, and also are arrayed in parallel to the gate electrodes 5 (X direction). On the other hand, the second electrode 34 that is electrically connected to a bit line 16 is arranged under the bit line 16 (preferably directly under), which is the same as for the first exemplary embodiment, but is not arranged to be on a line joining two adjacent first electrodes 33 along the X direction. A line joining an adjacent first electrode 33 and second electrode 34 is not parallel to the gate electrode 5 (X direction). At least one among two adjacent second electrodes 34 is preferably arrayed in parallel to the gate electrode 5 (X direction), so that the length of the plural phase change layers 12 is uniform.

In the present exemplary embodiment, an overall direction of extension of the phase change layer—electrode arrays (for example, an array direction of a dotted line shape of the first electrode 33 or the second electrode 34 in one phase change layer—electrode array) and a direction of extension of the active region 3 are not in parallel. For example, an angle formed by an overall direction of extension of the phase change layer—electrode array (X direction in FIG. 13) and a direction of extension of the active region is not 0° or 180°, but preferably is 25° to 155°, more preferably is 25° to 65° or 115° to 155°, and even more preferably 45° or 135°. Furthermore, a direction of partial extension of at least a portion of the phase change layer—electrode array and a direction of extension of the active region 3 are not parallel. For example, it is preferred that one angle formed by an array direction (or a direction of extension of a line joining centers of gravity of each thereof) of a pair of a first electrode 33 and second electrode 34 that are electrically connected to the same phase change layer 32, and a direction of extension of the active region 3 is 70° to 110° (preferably 90°) and the other angle is −20° to 20° (preferably 0°).

In the present exemplary embodiment shown in FIG. 13 to FIG. 15, one among two adjacent second electrodes 34 is arranged above (preferably directly above) a second impurity diffusion region 3b. In this case, a direction of extension of the active region 3 with respect to the X direction is 45°, for example, and in a case where one of the second electrodes 34 is arranged above the second impurity diffusion region 3b, lines joining adjacent first electrodes 33 and second electrodes 34 are respectively parallel to and perpendicular to a direction of extension of the active region 3.

In the embodiment shown in FIG. 13 to FIG. 15, the plurality of second electrodes 34 in one phase change layer—electrode array are arrayed on the same straight line, but may be arranged in two rows (on two straight lines) (that is, one electrode and two phase change layers connected thereto may be linear). For example, a second electrode 34 arranged above the second impurity diffusion region 3b is arranged on an upper side with regard to FIG. 13 compared to the first electrode 33, and a second electrode 34 that is not arranged above the second impurity diffusion region 3b may be arranged on a lower side with regard to FIG. 13 compared to the first electrode 33.

Figure 16A:
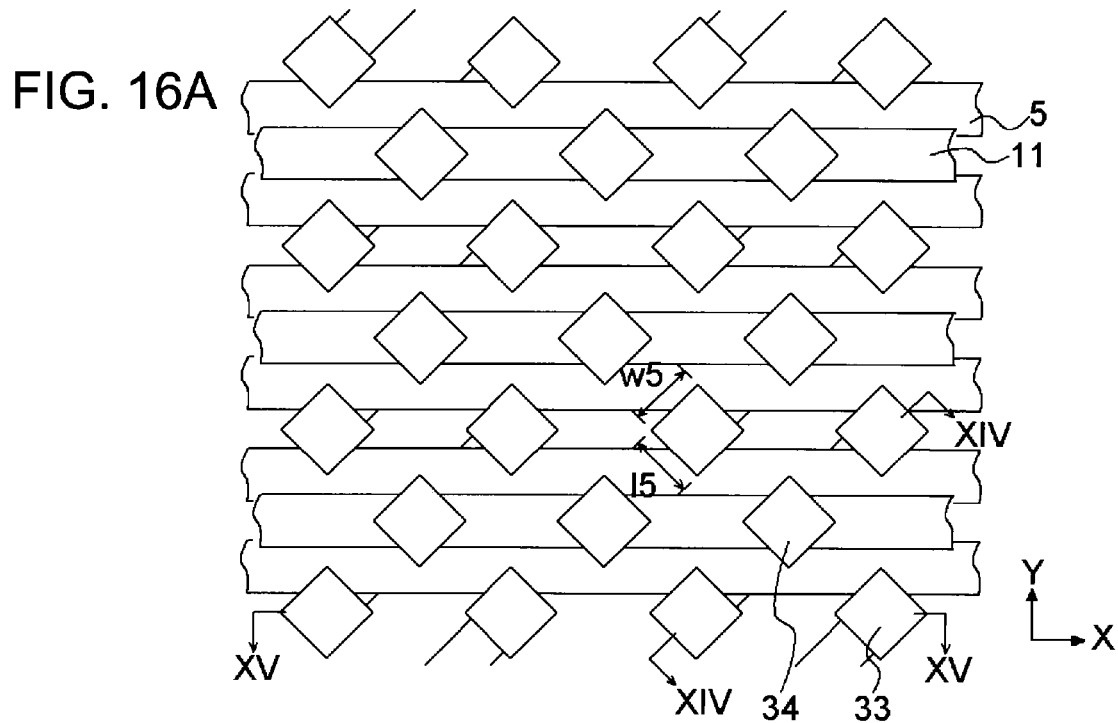
FIGS. 16A to 16C show a schematic process diagram of a method of manufacturing the phase change memory device according to the second exemplary embodiment of the present invention.

FIG. 16A is a schematic planar view of a state in which the first electrode 33 and the second electrode 34 are formed. The first electrode 33 and the second electrode 34 are preferably rectangular or square shaped. In a case where the first electrode 33 and the second electrode 34 are rectangular or square shaped, one side is preferably inclined at 25° to 65° (or 115° to 155°) to the X direction. Furthermore, length l5 of one side and width w5 of the first electrode 33 and the second electrode 34 are preferably 0.5 F to 2 F.

In the present exemplary embodiment, a phase change region 32a forms a base of a channel extending in a perpendicular direction to a line joining the first electrode 33 and the second electrode 34 connected to the phase change layer 32.

Other modes of the present exemplary embodiment are similar to the first exemplary embodiment.

According to the present exemplary embodiment, in comparison to the first exemplary embodiment, the phase change region 32a can be made wide, distance between adjacent electrodes 33 and 34 can be made short, and higher integration is possible. Furthermore, according to the present exemplary embodiment, it is possible for one select transistor to be shared by two memory parts 42a and 42b.

Next, a description is given concerning a method of manufacturing the phase change memory device according to the second exemplary embodiment of the present invention. FIG. 16A to FIG. 17C show outline process drawings of the method of manufacturing the phase change memory device according to the second exemplary embodiment of the present invention shown in FIG. 13 to FIG. 15. FIG. 16A to FIG. 17A are outline planar views of portions corresponding to a plane shown in FIG. 13; FIG. 16B to FIG. 17B are outline cross-sectional views of portions corresponding to the cross-section XIV-XIV shown in FIG. 13; and FIG. 16C to FIG. 17C are outline cross-sectional views of portions corresponding to the cross-section XV-XV shown in FIG. 13. Furthermore, in FIG. 16A to FIG. 17A, the side wall 6 and the gate electrode protection insulating film 7 of the gate electrode 5, a lower insulating layer 18, and an upper insulating layer 19 are omitted from the drawings.

Figure 16B:
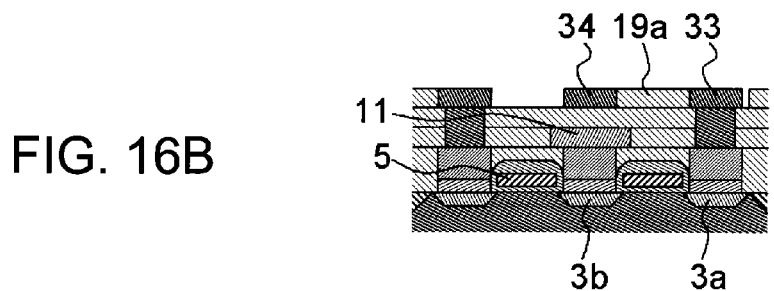
Figure 16C:
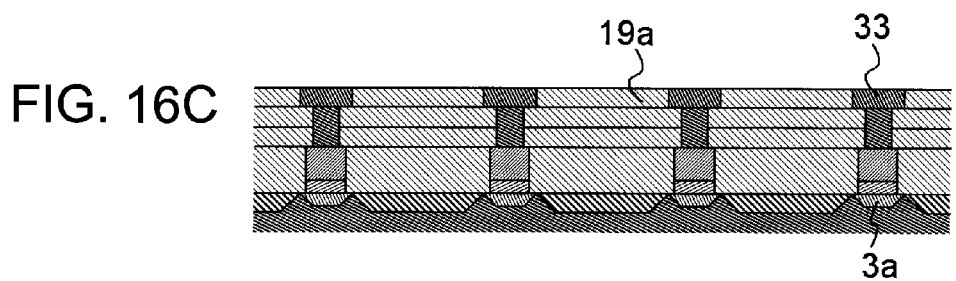

First, an intermediate product is manufactured in the same way as processes according to the first exemplary embodiment shown in FIG. 4A to FIG. 9C. Next, the first electrode 33 is formed on a contact plug 17, and the second electrode 34 is formed at a position below the bit line 16 (FIGS. 16A to 16C). For example, initially, a first upper insulating layer 19a formed from BPSG is deposited on the entire surface. Next, using lithography technology, a concave portion is formed at a prescribed position of the first upper insulating layer 19a, by etching. The contact plug 17 is exposed at a position where the first electrode 33 is formed. Next, an electrically conductive material, such as tungsten (W) or the like is deposited in the concave portion by a sputter method or the like. Next, the first electrode 33 and the second electrode 34 are formed by polishing and flattening using a CMP method or the like, so as to have the same height as the first upper insulating layer 19a. Next, using lithography technology, only the first upper insulating layer 19a existing between the first electrode 33 and the second electrode 34 forming the phase change layer 32 is selectively removed by etching.

Figure 17A:
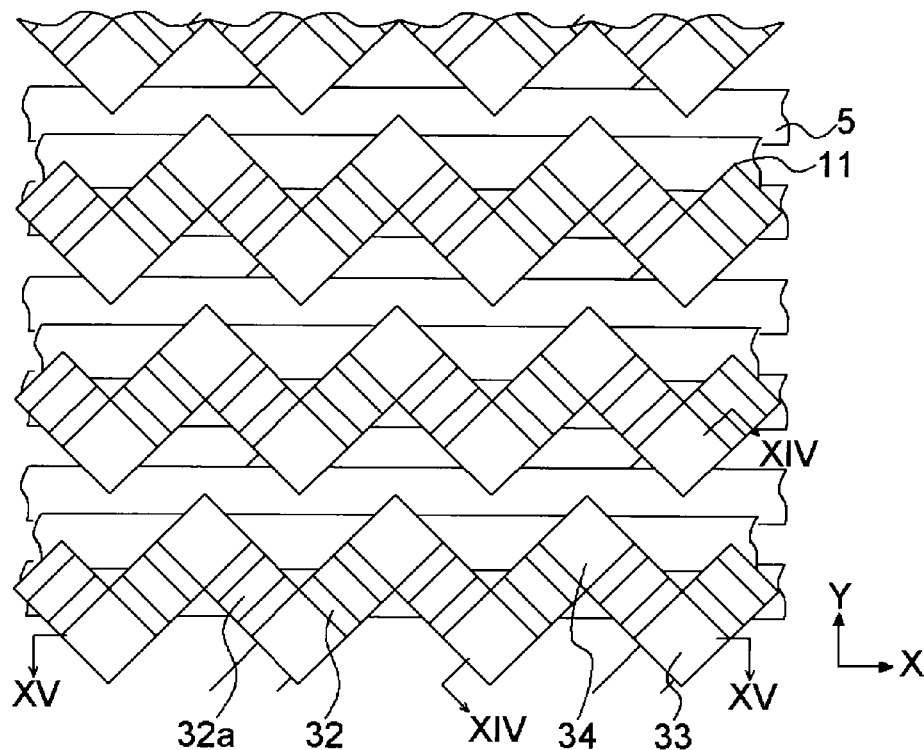
FIGS. 17A to 17C show a schematic process diagram of a method of manufacturing the phase change memory device according to the second exemplary embodiment of the present invention.
Figure 17B:
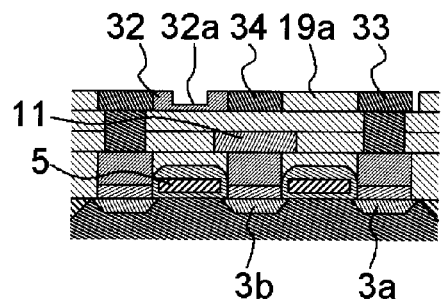
Figure 17C:
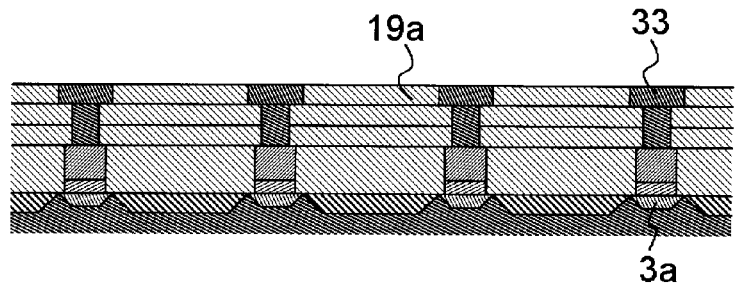

Next, the phase change layer 32 is formed between the first electrode 33 and the second electrode 34 (FIGS. 17A to 17C). For example, first, material of the phase change layer 32 such as $Ge_2Sb_2Te_5$ or the like is deposited between the first electrode 33 and the second electrode 34. Next, by polishing and flattening the deposited material, by a CMP method or an etching method, the height of the phase change layer 32 and the height of the electrodes 33 and 34 are made the same. Next, using lithography technology, a portion of the phase change layer 32 is made thin by etching, and the phase change region 32a is formed in the phase change layer 32.

A bit line contact 35 is formed on the second electrode 34, in the same way as a process according to the first exemplary embodiment shown in FIGS. 12A to 12C. Next, the bit line 16 is formed on the bit line contact 35 in the same way as a process according to the first exemplary embodiment. Next, by additionally depositing a part of the upper insulating layer on the uppermost layer in the same way as a process according to the first exemplary embodiment, it is possible to manufacture a lateral phase change memory device 41 as shown in FIG. 13 to FIG. 15.

In the abovementioned exemplary embodiments a description was given with a phase change material as an example of the variable resistance material, but the variable resistance material in the present invention is not limited to the phase change material. For example, as the variable resistance material, it is possible to otherwise use a variable resistance material mainly utilizing a metallic oxide formed from, for example, titanium oxide ($TiO_2$), nickel oxide (NiO), copper oxide (CuO), or more elements than these.

An explanation of the nonvolatile memory device of the present invention has been given based on the abovementioned embodiments, but there is no limitation to the abovementioned embodiments, and clearly various types of modifications, changes and improvements of the abovementioned embodiments can be included, within the scope of the present invention and based on fundamental technological concepts of the invention. Furthermore, a wide variety combinations, substitutions, and selections of various disclosed elements are possible within the scope of the claims of the present invention.

Further issues, objects and amplified embodiments of the present invention will become clear from the entire disclosed matter of the invention including the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
an active region comprising a first diffusion region, a second diffusion region, a third diffusion portion, a first channel region between the first and second diffusion regions and a second channel region between the second and third diffusion regions, the first, second and third diffusion regions and the first and second channel regions being arranged in line in a first direction;
a first word line elongated in a second direction that is oblique to the first direction to cross the first channel with an intervention of a first gate insulating film therebetween;
a second word line elongated in the second direction to cross the second channel region with an intervention of a second gate insulating film therebetween;
a first insulating layer formed to cover the active region and the first and second word lines;
a reference line formed over the first insulating layer and elongated in the second direction to cross the second diffusion region with an intervention of a part of the first insulating layer;
a first contact plug formed in the part of the first insulating layer to connect the second diffusion region electrically to the reference line;
a second insulating layer formed to cover the first insulating layer and the reference potential line;
second and third contact plugs selectively formed in the first and second insulating layers to be in electrical contact respectively with the first and third diffusion regions;
a third insulating layer formed over the second insulating layer and the second and third contact plugs;
a bit line formed over the third insulating layer and elongated in a third direction that is substantially perpendicular to the second direction to cross the first and second word lines and the reference line;
a first information storage element formed between the second and third insulating layers, the first information storage element being in electrical contact with the second contact plug and being elongated toward the bit line in a fourth direction that is different from the first direction;
a fourth contact plug selectively formed in the third insulating layer to contact the first information storage element electrically to a first portion of the bit line;
a second information storage element formed between the second and third insulating layers separately from the first information storage element, the second information storage element being in electrical contact with the third contact plug and being elongated toward the bit line; and
a fifth contact plug selectively formed in the third insulating layer to contact the second information storage element electrically to a second portion of the bit line, the second portion of the bit line being apart from the first portion of the bit line.

2. The device as claimed in claim 1, wherein the fourth direction is the same as the second direction.

3. The device as claimed in claim 1, wherein the second information storage element is elongated toward the bit line in a fifth direction that is different from the first direction.

4. The device as claimed in claim 3, wherein each of the fourth and fifth directions is the same as the second direction.

5. The device as claimed in claim 4, wherein the first, fourth and fifth contact plugs arc arranged in line in the third direction, and the first contact plug is between the fourth and fifth contact plugs.

6. The device as claimed in claim 4, each of the first and second information storage elements includes a first end portion that is in contact with an associated one of the second and third contact plugs, a second end portion that is in contact with an associated one of the fourth and fifth contact plugs, and a third portion that is between the first and second end portions and is smaller in thickness than each of the first and second end portions.

7. The device as claimed in claim 6, further comprising a third information storage element formed between the second and third insulating layers separately from each of the first and second information storage elements, the third information storage element being in electrical contact with the fourth contact plug and being elongated in the second direction.

8. The device as claimed in claim 7, further comprising a fourth information storage element formed between the second and third insulating layers separately from each of the first, second and third information storage elements, the fourth information storage element being in electrical contact with the fifth contact plug and being elongated in the second direction.

9. The device as claimed in claim 8, each of the third and fourth information storage elements includes an end portion that is in contact with an associated one of the fourth and fifth contact plugs and a body portion that is elongated from the end portion and smaller in thickness than the end portion.

10. The device as claimed in claim 1, wherein the fourth direction is oblique to each of the second and third direction.

11. The device as claimed in claim 1, wherein the second information storage element is elongated toward the bit line in the first direction.

12. The device as claimed in claim 1, wherein the fourth direction is oblique to each of the second and third direction, and the second information storage element is elongated toward the bit line in the first direction.

13. The device as claimed in claim 12, wherein the fifth contact plug overlaps with the first contact plug, and fourth and fifth contact plugs are arranged in line in the third direction.

14. The device as claimed in claim 12, each of the first and second information storage elements includes a first end portion that is in contact with an associated one of the second and third contact plugs, a second end portion that is in contact with an associated one of the fourth and fifth contact plugs, and a third portion that is between the first and second end portions and is smaller in thickness than each of the first and second end portions.

15. The device as claimed in claim 14, further comprising a third information storage element formed between the second and third insulating layers separately from each of the first and second information storage elements, the third information storage element being in electrical contact with the fourth contact plug and being elongated in the first direction.

16. The device as claimed in claim 15, further comprising a fourth information storage element formed between the second and third insulating layers separately from each of the first, second and third information storage elements, the fourth information storage element being in electrical contact with the fifth contact plug and being elongated in the fourth direction.

17. The device as claimed in claim 16, each of the third and fourth information storage elements includes an end portion that is in contact with an associated one of the fourth and fifth contact plugs and a body portion that is elongated from the end portion and smaller in thickness than the end portion.

* * * * *